United States Patent [19]
Hendrickson et al.

[11] Patent Number: 4,735,914
[45] Date of Patent: Apr. 5, 1988

[54] FET FOR HIGH REVERSE BIAS VOLTAGE AND GEOMETRICAL DESIGN FOR LOW ON RESISTANCE

[75] Inventors: Thomas E. Hendrickson; Ronald G. Koelsch, both of Hennepin County, Minn.

[73] Assignee: Honeywell Inc., Minneapolis, Minn.

[21] Appl. No.: 895,084

[22] Filed: Aug. 8, 1986

Related U.S. Application Data

[62] Division of Ser. No. 24,840, Mar. 28, 1979, abandoned.

[51] Int. Cl.[4] .................. H01L 21/425; H01L 29/72
[52] U.S. Cl. ........................................ 437/44; 437/45; 437/49; 437/913
[58] Field of Search ............. 148/DIG. 43, DIG. 141; 357/23.8, 53, 54, 41, 23.9, 23.14, 23.4; 437/41, 44, 49, 913

[56] References Cited

U.S. PATENT DOCUMENTS

| | | | |
|---|---|---|---|
| 3,533,158 | 10/1970 | Bower et al. | 29/571 |
| 3,573,571 | 4/1971 | Brown et al. | 29/571 |
| 3,657,614 | 4/1972 | Cricchi | 357/23.4 |
| 3,679,492 | 7/1972 | Fang et al. | 29/571 |
| 3,775,191 | 11/1973 | McQuhae | 29/571 |
| 3,793,721 | 2/1974 | Wakefield | 29/571 |
| 3,845,495 | 10/1974 | Cauge et al. | 357/49 |
| 3,996,657 | 12/1976 | Simko et al. | 29/571 |
| 4,062,699 | 12/1977 | Armstrong | 29/571 |
| 4,084,311 | 4/1978 | Yasuoka | 29/571 |
| 4,148,047 | 4/1979 | Hendrickson | 357/41 |
| 4,172,260 | 10/1979 | Okabe et al. | 357/51 |
| 4,599,576 | 7/1986 | Yoshida et al. | 357/42 |

FOREIGN PATENT DOCUMENTS 0089686 8/1978 Japan .................. 357/23.5

OTHER PUBLICATIONS

Dill, "A New Insulated Gate Tetrode with High Drain Breakdown Potential and Low Miller Feedback Capacitance", IEEE Trans. on Electron. Devices, vol. ED-15, No. 19—Oct. 68, pp. 717–726.

Primary Examiner—Olik Chaudhuri
Attorney, Agent, or Firm—William T. Udseth

[57] ABSTRACT

Field-effect transistor devices are provided having a relatively substantial capability to withstand reverse bias voltages. This capability is provided through providing shields in these devices near junctions in such devices which are subject to breakdown under large reverse bias voltages, these shields being operable at selected voltages. The device can also be provided having a relatively low "on" condition resistance between the source and drain terminals thereof by virtue of a geometrical design choice. A method for fabricating one such device is also disclosed.

13 Claims, 15 Drawing Sheets

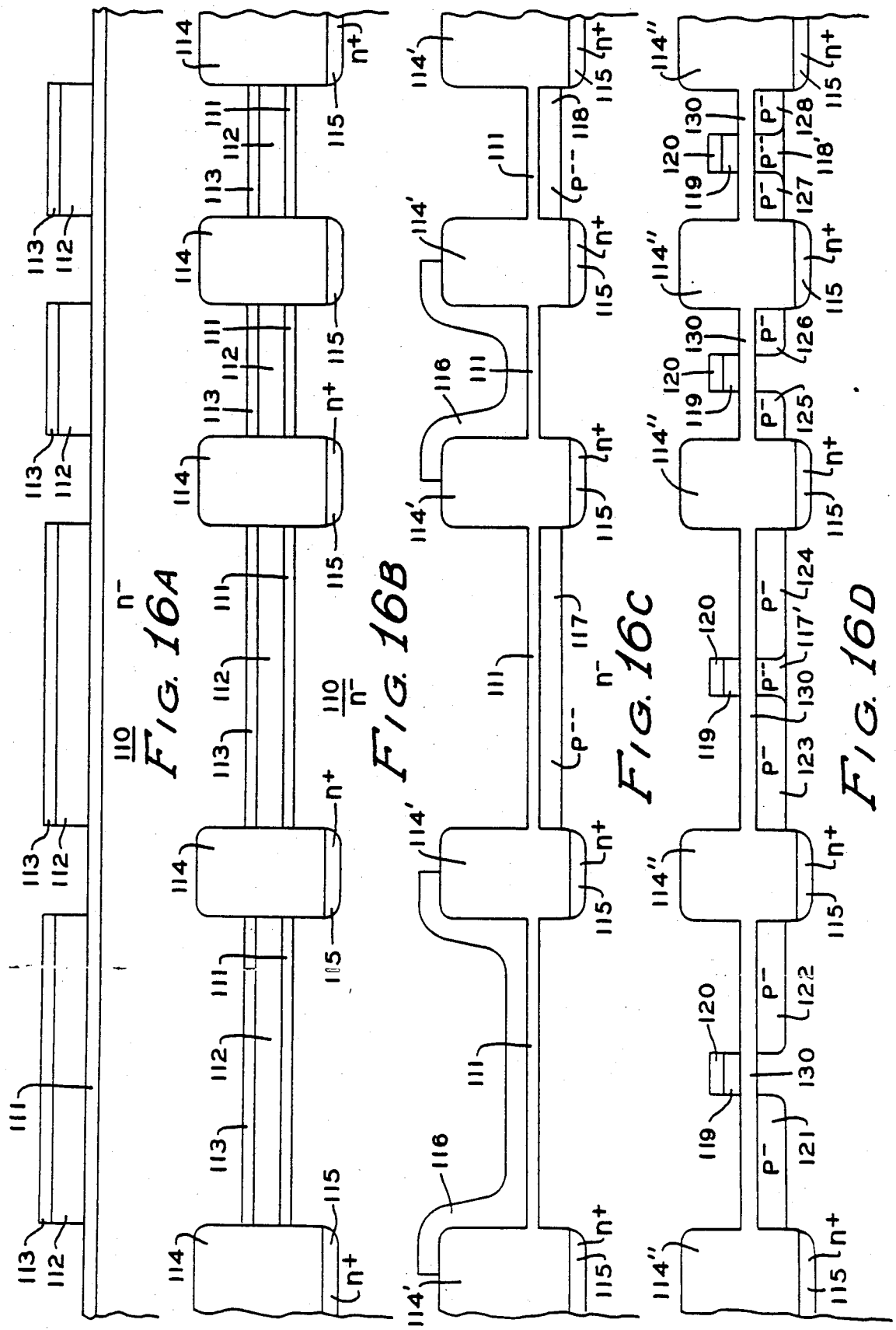

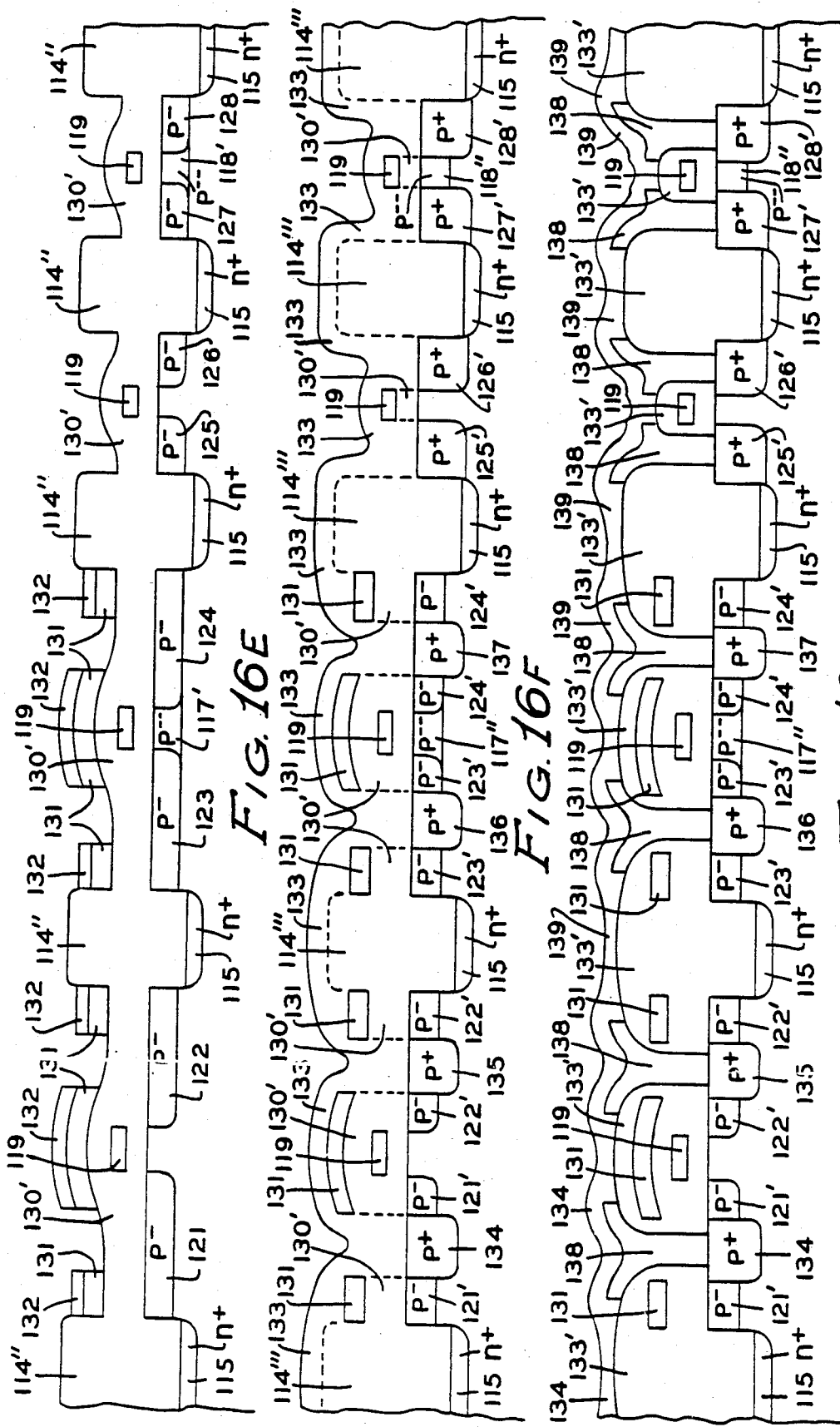

FET FOR HIGH REVERSE BIAS VOLTAGE AND GEOMETRICAL DESIGN FOR LOW ON RESISTANCE

This application is a division of application Ser. No. 024,840, filed Mar. 28, 1979, now abandoned.

REFERENCE TO COPENDING APPLICATIONS

Reference is hereby made to copending application by D. B. Butler, T. E. Hendrickson and R. G. Koelsch entitled "Semiconductor Apparatus" now issued as U.S. Pat. No. 4,235,011, which was filed on even date with the present application and which is assigned to the same assignee as the present application. This copending application discloses to some extent but does not claim either the semiconductor devices, or the method for fabricating one of them, which are specifically disclosed and claimed in the present application. Reference is also made to earlier filed co-pending applications, all assigned to the same assignee, by T. E. Hendrickson entitled "Semiconductor Apparatus" having Ser. No. 869,981, by T. E. Hendrickson, et. al., entitled "Semiconductor Apparatus" having Ser. No. 869,980, and by T. E. Hendrickson, et. al., entitled "Semiconductor Apparatus" having Ser. No. 869,977, all of which disclose, and some claim, semiconductor devices related to the devices of the present application.

BACKGROUND OF THE INVENTION

The present invention is related to the fabrication and structure of field-effect transistor devices for electrical signal control and switching, particularly analog signals, and more particularly, to the geometry and other material properties of the field-effect transistor device design for a field-effect transistor device analog signal switch, and the fabrication thereof.

The field-effect transistor has certain attributes which are attractive for analog signal switching. The first of these is that a field-effect transistor can be a bilateral device so that, for alternating polarity waveforms, the field-effect transistor appears to have the same output characteristics whatever the waveform polarities are at which the designated source and drain regions in the device happened to be operated at during any point in a waveform cycle. Further, there is no offset voltage in the source-drain volt-ampere characteristics of a common source operated field-effect transistor as there is in the collector volt-ampere characteristic of a common emitter operated bipolar transistor.

A problem with the field-effect transistor for use as an analog signal switch exists, however, in that the "on" condition resistance between the drain and source of the field-effect transistor is typically quite a bit higher than that experienced, for instance in the output of a bipolar transistor. Such an "on" condition drain-to-source resistance, or channel resistance, has deleterious effects on switching operations. First, this resistance increases the power dissipation occurring in the switch when in the "on" condition, a situation which is particularly troublesome if the field-effect transistor device is to be used as a power device carrying substantial currents in the "on" condition. Secondly, this "on" condition resistance slows the switching speed of the field-effect transistor-load combination limiting the usefulness of the switch for controlling rapidly changing analog signals.

For field-effect transistors formed in a semiconductor body, such as in FIG. 1A, the "on" condition drain-to-source resistance has been found to depend upon various material parameters of the materials used in the construction thereof, and upon the dimensions thereof; in the latter instance, particularly, upon the effective width and length of the field-effect transistor device in the semiconductor material used. That is, the "on" condition channel resistance is dependent upon the effective length of the channel between the sources and drains therein, and upon the effective width of the channel between sources and drains therein facing one another across the channel. The following relationship has been found:

$$R_{on} \propto L/W$$

As is also known, the "punch-through" voltage and the device switching time device parameters are each determined substantially by the channel length, L, with both decreasing with decreasing L. Thus, one might conclude that channel length L in the stripe geometry transistor of FIG. 1A should be made as small as practically possible while increasing the channel width, w, to the extent necessary to achieve a satisfactorily small $R_{on}$. That is, one might keep the channel length as short as possible, consistent with the design layout rules required by the fabrication process and with the need to maintain an adequate punch-through voltage minimum for operation in the "off" condition, and then extend the channel width until a satisfactory "on" condition drain-to-source resistance is achieved. The result of this design criteria is suggested in FIG. 1B.

In FIGS. 1A and 1B, the source region, 10, is formed beneath, but intersecting, a planar major surface of a semiconductor material body, this surface supporting an insulating layer thereover. The source region is also marked by S. A cut or opening, 11, in the insulating layer is shown to accommodate an electrical contact to source 10, and this contact is shown made by an external interconnection means, 12, in FIG. 1A. There need not be an external connector, however, as source region 10 may be extended to other regions in the semiconductor material body to thereby provide its own interconnection. No such external interconnection is shown in FIG. 1B where source 10 is indicated to extend indefinitely until some value of w is reached which provides a suitably small "on" condition channel resistance. Again, however, between solid lines, region 11 is shown in FIG. 1B to accommodate an external interconnection means.

A drain region, 13, is shown in FIGS. 1A and 1B and marked with a D. Again, a cut or opening, 14, is shown for providing a connection to source 13 via this opening by an external interconnection means, 15, by way of example. In FIG. 1B, again the drain region 13 shown to extend indefinitely until a satisfactory w dimension is reached to provide a sufficiently small $R_{on}$.

FIGS. 1A and 1B each have a gate structure, 16, between source region 10 and drain region 13. Structure 16 may either be a gate conductor for a MOSFET, separated therefrom by an insulating layer, or structure 16 may be part of an interconnection means for electrically connecting to the gate region provided in a JFET.

Thus, FIG. 1B represents a possible method for increasing the channel width w to the extent necessary to reduce the "on" condition channel resistance. However, the efficacy of such a structure must be questioned for use as an analog signal switch because the long gate leads, and perhaps the source and drain leads, introduce added resistance which has a negative effect on the switching time and which increases power dissipation. Further, such a structure will take up area in a major surface when formed in a monolithic integrated circuit with no indication that the area is being consumed optimally.

Using up such area in a major surface of a monolithic integrated circuit is an expensive proposition. Experience has shown that the yield of operable integrated circuit chips from the fabrication process for a given monolithic integrated circuit is inversely proportional to the area of the major surface taken up by that monolithic integrated circuit. The cost, then, for a good monolithic integrated circuit chip is inversely proportional to the number of such chips formed in a wafer times the yield, with the result that the cost becomes proportional to the square of the area taken up in the major surface of the monolithic integrated circuit chip.

Thus, when considering the production of a monolithic integrated circuit chip, there is an extreme importance attached to the minimizing of the area of the major surface required therein. For field-effect transistor devices fabricated at a major surface of a monolithic integrated circuit, the minimization of the area of this major surface devoted to such field-effect transistor devices, for a given "on" channel resistance, is equivalent to minimization of the "on" condition channel resistance-device area product ($R_{on}A$). This is because the $R_{on}$ product ultimately determines the size of the monolithic integrated circuit chip major surface required to accommodate such field-effect transistor devices. Minimizing the field-effect device surface area used for a given "on" condition channel resistance also serves to minimize the gate area over the channel region, which improves switching speed by reducing both gate means resistance and the capacitances associated therewith.

FIG. 1C shows an alternative way to effectively increase the channel width while maintaining the channel length as small as possible. That is, rather than having a single long source, a single long drain, and a single long gate, there are provided multiple sources, drains, and gates repeated in a stripe effect pattern. This essentially represents dividing the structure of FIG. 1B several times and placing the resulting portions side by side.

Another geometrical layout which seeks to further reduce the $R_{on}A$ product beyond that reduction achieved by the structure of FIG. 1C is shown in U.S. Pat. No. 3,783,349 to Beasom. The Beasom reference discloses arranging rectangular or square source and drain regions in a semiconductor material body, separated by surfaces in the body major surface associated with gate portions, to form a grid or rectangular mesh arrangement having the sources and drain regions along intersections or centers of a grid pattern formed by sets of perpendicular lines. A portion of the essence of the pattern in the Beasom reference is repeated in FIG. 2 herein.

Source regions intersecting the surface of the semiconductor material body in FIG. 2 are again marked with S and by the numeral 10. The drain regions on the semiconductor material body are again marked with D and by the numeral 13. The portions of FIG. 2 associated with the gate regions are again marked with the letter G and by the numeral 16. Once again, the device of FIG. 2 is assumed to have an insulating layer over a semiconductor material body leading to the source and drain regions being shown in dashed lines. No interconnection means for the sources and drains are shown. Those portions of the source and drain regions which electrical contact would be made are shown by the solid line openings which are again marked by the numerals 11 and 14.

A further design geometry for this purpose is shown in U.S. Pat. No. 4,015,278 to Fukuta. In this situation, the sources are shown in the geometrical form of a letter "Y" while the drains are shown in geometrical form of a hexagon.

These alternative geometrical designs for field-effect transistors do indeed appear to aid in reducing the $R_{on}A$ product from the initially shown geometrical design layouts of FIGS. 1A and 1B for the various layout criteria. However, further improvements in the reduction of the $R_{on}A$ product are most desirable, especially where the field-effect transistor device is to be formed in a monolithic integrated circuit and be capable of controlling substantial currents therethrough without overheating the monolithic integrated circuit chip.

A further consideration for using a field-effect transistor in an analog switching situation is the ability thereof to withstand reverse bias voltages of substantial magnitude. That is, the device should have a substantial minimum punch-through voltage and a substantial minimumn breakdown voltage. This is difficult to achieve, particularly for devices used in monolithic integrated circuits.

SUMMARY OF THE INVENTION

A field-effect transistor device is provided capable of withstanding a substantial reverse bias voltage by using shield electrodes adjacent to the semiconductor material source or drain region portions, i.e., channel terminating regions, or both. These may be semiconductor material source and drain regions having dopant concentrations therein such as to permit substantial depletion thereof under reverse bias before breakdown or to otherwise alter the electric field in the depletion region. Such shield electrodes will, in some instances, be connected to the gate electrode of the field-effect transistor device. Further, portions of the field-effect transistor device involved in the gate region can serve to separate triangular areas formed in a densely packed matrix structure to provide a low "on" condition channel resistance. A method for constructing one such field-effect device having both a gate region and a shield region therein is disclosed where these regions provide self-alignment of various portions of the source and drain regions.

BRIEF DESCRIPTION OF THE DRAWINGS

FIGS. 13A, 13B and 13D show a cross section of other versions of a field-effect transistor device that can also withstand substantial reverse bias voltage while FIGS. 14A, 14B and 14C show a cross section of other versions of a field-effect transistor device that can also withstand a substantial reverse bias voltage while FIG. 16A, 16B, 16C, 16D, 16E, 16F and 16G show the results of steps in a method for fabricating a field-effect transistor device of the kind shown in FIG. 14C.

DESCRIPTION OF THE PREFERRED EMBODIMENTS

The effect of the geometrical arrangement in the present invention of the source and drain regions in a field-effect transistor device for the purpose of decreasing the characterizing $R_{on}A$ product below that achieved in prior art structures can be shown by a mathematical model representing possible geometrical arrangements generally. Then, manipulation of that model may permit finding better geometrical arrangements. Understanding and attacking the problem of field-effect transistor device design for devices suitable for handling substantial power in a monolithic integrated circuit, or other small structure, in this manner does not appear to have occurred in the prior art and so the results are not found there either.

The problem of minimization of the $R_{on}A$ product of a surface field-effect transistor device has been found to be directly analogous to the problem of densely packing two-dimensional figures on a plane. This is so because the surface field-effect transistor device formed at the major surface of a semiconductor material body is essentially a two-dimensional device. That is, given a specific "on" condition channel resistance which must not be exceeded, minimize the area taken up by the geometrical arrangement of the field-effect transistor device in the major planar surface of the semiconductor material body containing the device.

The value for the effective channel length L, as earlier indicated, is to be kept as small as possible for reasons of aiding in minimizing both switching speed and "on" condition channel resistance minimization. The value of L finally chosen is, of course, subject to the construction of satisfying the design layout rules with regard to minimum spacings, as required by the process used to fabricate the field-effect transistor device, and of satisfying the minimum punch-through voltage requirement for the transistor when operated in the "off" condition. Thus, the value of L is not subject to being varied for the purposes of reducing device area leaving, as earlier indicated, the effective channel width w to be varied for these purposes. In these circumstances, the problem of minimizing the $R_{on}A$ product for the device can be restated as selecting the effective channel width w dimension necessary to obtain a satisfactorily small "on" condition channel resistance, and then minimizing the area of the resulting field-effect transistor device. Of course, the effective channel width w is subject to the same fabrication process dictated design layout rules mentioned in connection with channel length.

Figure 1C:
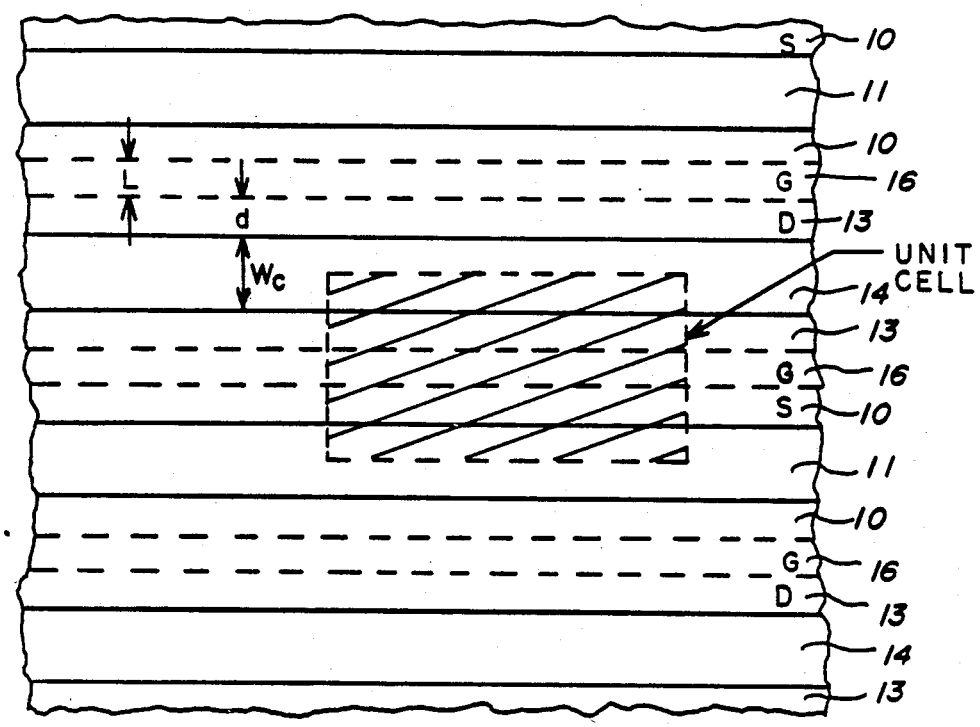
FIGS. 1A, 1B and 1C show field-effect transistor device source, drain and gate geometrical arrangements known in the prior art.
Figure 1A:
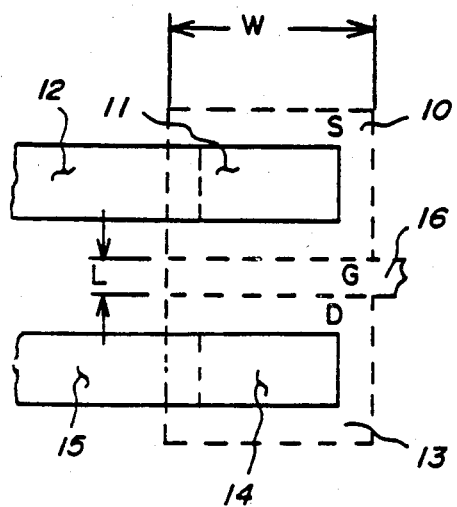

The layout shown in FIGS. 1A, B, and C is based on only the lowest order two-dimensional point symmetry group in the group theory of two-dimensional lattice geometrical figures. The geometrical arrangement shown in FIG. 2 makes use of a higher order point symmetry group, four-fold rotational symmetry.

However, from group theory, the problem above has as solutions the point groups 2, 4 mm, 6 mm, and 2 mm (i.e., geometrical figures possessing rotational symmetries of one-, two-, three-, four-, and six-fold). Since surface related field-effect transistor devices inherently possess a two-fold symmetry themselves, only those groups which can be decomposed into a two-fold and n-fold axis are actual solutions of the problem. Thus, not only are layouts possessing two-fold and four-fold rotational symmetry satisfactory solutions to the problem, but also layouts possessing six-fold rotational symmetry represent proper, densely packed device arrangement solutions. In practice, since one layer of metal must have a two-fold or lower symmetry, these layouts must be implemented with rectangles for the four-fold symmetry case, as shown for a device portion in FIG. 2, or with triangles for the six-fold symmetry case, a portion of which is shown in FIG. 3A.

The device portion shown in FIG. 3A again has source and drain regions, shown by dashed lines, formed in a semiconductor material body and intersecting a major surface thereof which surface supports an insulating layer. The intersection in the major surface of the source and drain regions provide densely packed triangular surface portions in the major surface. The triangular surface portions are shown a equilateral triangles which are preferred though not necessary. FIG. 3A again has the source regions 10 marked with an S. Drain regions 13 are again marked with a D, and finally, the gate regions 16 are again marked with a G. Small solid line triangles are shown where electrical contact would be made to the source and drain regions by the source interconnection means and the drain interconnection means, respectively.

Figure 2:
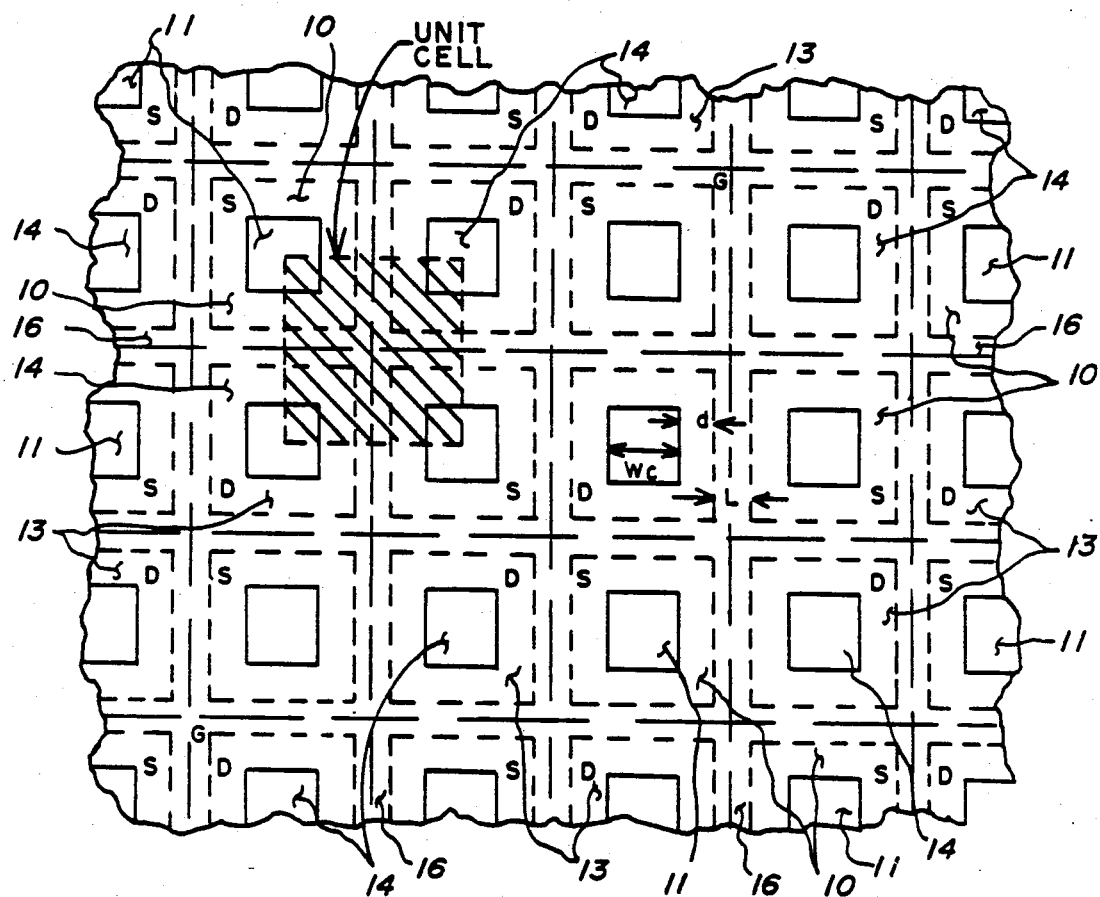
FIG. 2 shows a field-effect transistor device source, drain and gate geometrical arrangement known in the prior art.
Figure 3A:
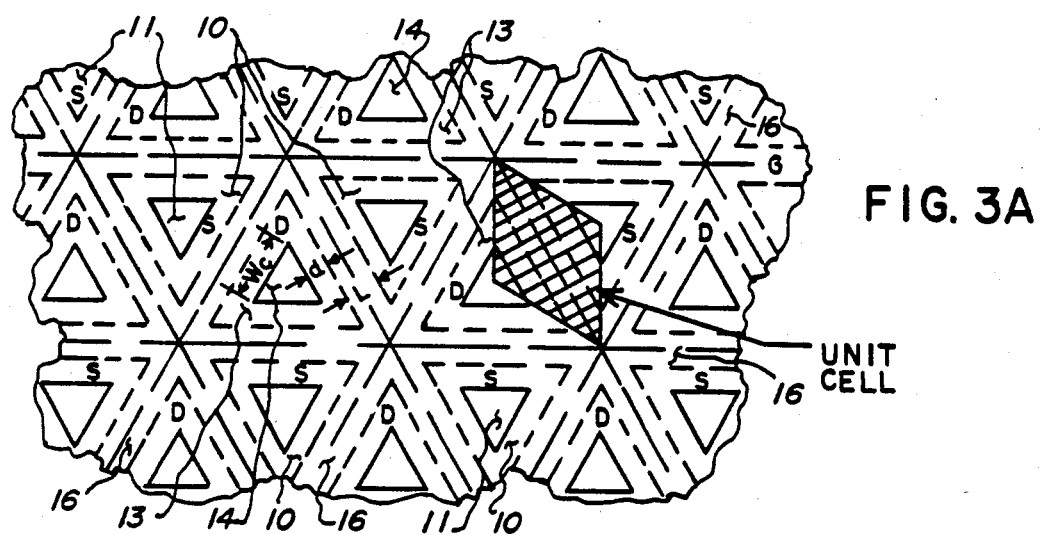
FIG. 3A, 3B, and 3C show various field-effect transistor device source, drain and gate geometrical arrangements.

The long dashed lines along the separating surfaces between the source and drain triangular surface portions, forming the mesh network in the triangular mesh associated with the gate in FIG. 3A, provide extended triangles around each of the triangular surface portions representing a source or a drain. These extended triangles include an associated part of the gate mesh with each source and drain triangular surface portion. When these larger triangular surface portions are considered in relation to one another, the extended triangles (shown here as equilateral triangles just as are the triangular surface portions of the source and drain regions) make clear the six-fold rotation symmetry in forming a densely packed hexagonal matrix structure. Similarly, long dashed lines have been added in FIG. 2 to form extended quadrilateral surfaces, actually squares, in the rectangular mesh, or square mesh, shown there. These larger square portions make clear the four-fold rotational symmetry in forming a densely packed rectangular matrix structure.

To determine the relative merits of the various layouts possible within the bounds of the group theoretical solutions indicated above, the RA product must be evaluated for each. To do so, the assumption is made that each field-effect transistor device associated with an evaluated layout will be operating in the linear region at small values of drain to source voltage, $V_{DS}$. The well-known equation for the "on" condition channel resistance for a MOSFET, as an example, is given by the following expression:

$$R_{on} = \frac{L_{eff}}{w_{eff}\mu C_{ox}(V_{GS} - V_T)}$$

The meanings of the symbols used in the foregoing equation are the following:

$R_{on} \triangleq$ "on" condition channel resistance.
$L \triangleq$ channel length.
$w_{eff} \triangleq$ effective channel width.
$C_{ox} \triangleq$ capacitance per unit area of gate-oxide capacitor.
$\mu \triangleq$ mobility of channel carriers.
$V_{GS} \triangleq$ gate to source voltage.
$V_T \triangleq$ threshold voltage.

To proceed with the analysis, the $R_{on}A$ product is now found by first substituting for $w_{eff}$, in the foregoing equation, the value obtained therefor from the unit cell in each of the layouts shown in FIGS. 1C, 2, and 3A which represent the layout solutions found within the bounds of the group theory set out above. The unit cells in these three figures each represent the associated minimum dimension basic cell for each of the layouts therein, respectively, as determined by the group theory used. Finding the $R_{on}A$ product for the layout in each of FIGS. 1C, 2, and 3 is then completed by multiplying the associated version of the foregoing equation—now containing the appropriate substitution for $w_{eff}$—by the area of the corresponding unit cell.

The following equations are obtained for the geometrical arrangements shown in FIGS. 1C, 2, and 3:

$$(R_{on}A)_{FIG.1C} = \frac{L(L + w_c + 2d)}{\mu C_{ox}(V_{GS} - V_T)}$$

$$(R_{on}A)_{FIG.2} = \frac{L(L + w_c + 2d)}{\mu C_{ox} 2(w_c + 2d)(V_{GS} - V_T)}$$

$$(R_{on}A)_{FIG.3A} = \frac{2(3)^{\frac{1}{2}} L \left[ \frac{w_c}{2(3)^{\frac{1}{2}}} + d + \frac{L}{2} \right]^2}{\mu C_{ox} [w_c + 2(3)^{\frac{1}{2}} d](V_{GS} - V_T)}$$

In these equations, $w_c$ represents the width of the electrical contact made by the interconnection means to each of the source and drain region major surface portions, while d represents the minimum required spacing between the electrical contacts and the edge of the channel in each of the source and drain region major surface portions.

Figure 1B:
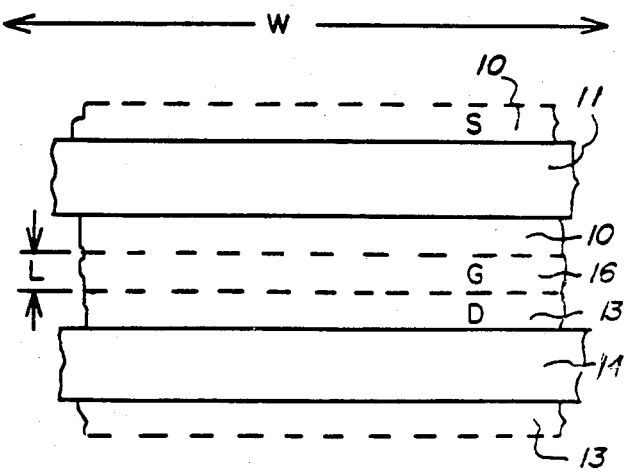

The meaning of the last three equations resulting for the $R_{on}A$ products of the layouts in FIGS. 1C, 2, and 3A can be seen by comparing the equation values when a defined parameter representing the effective channel width per source or drain region, $(w_c+2d)$, is varied with respect to the effective channel length L. In the limit where the channel width parameter is much greater than the channel length, i.e. $(w_c+2d)>>L$, the $R_{on}A$ product representing the perpendicular lines-of-centers grid of FIG. 2, $(R_{on}A)_{FIG. 2}$, approaches being one half of the $R_{on}A$ product for the repeated stripe geometry of FIG.1C, $(R_{on}A)_{FIG. 1C}$ for identical values of $w_c$, d, and L. On the other hand, the $R_{on}A$ product for the triangular mesh of FIG. 3A, $(R_{on}A)_{FIG. 3A}$, shows the improvement achieved by the present invention in being but a third of that for the repeated stripe layout geometry of FIG. 1C. To restate, the following results are obtained in the desired situation of using as short as possible channel lengths:

$(R_{on}A)_{FIG. 2} \rightarrow 0.50(R_{on}A)_{FIG. 1C}, (w_c+2d)>>L$ $(R_{on}A)_{FIG. 3A} \rightarrow 0.33(R_{on}A)_{FIG. 1C}, (w_c+2d)>>L$ For the same equations, when $(w_c+2d)$ is approximately equal to L the RA products for all three of the layouts of FIGS. 1C, 2, and 3A are nearly equal. Finally, when $(w_c+2d)$ is much less than L. the layout of FIG. 1 turns out to have the lowest $R_{on}A$ product.

Figure 4:
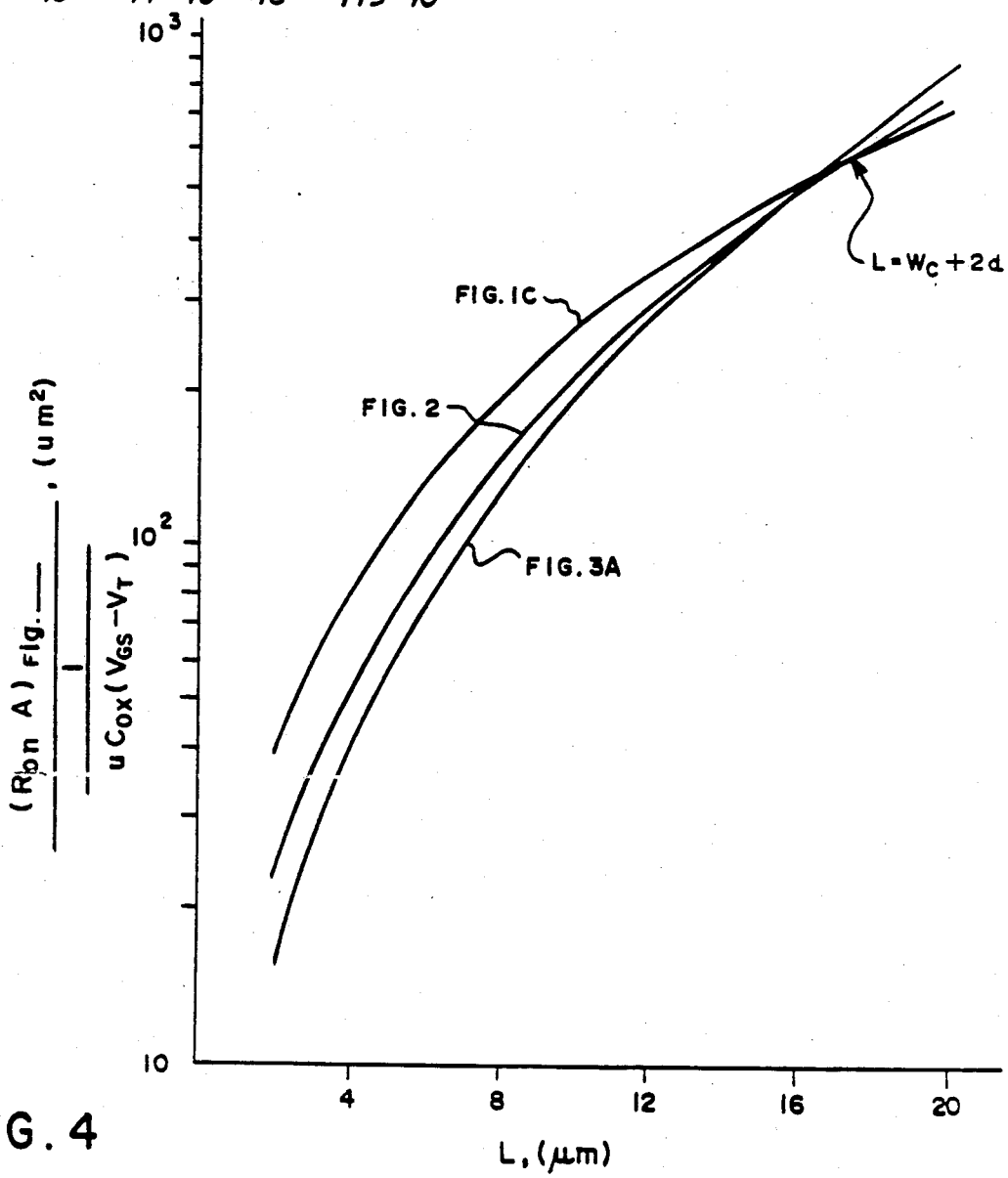
FIG. 4 shows a graph of the "on" condition channel resistance-device area product versus channel length for three field-effect transistor device source, drain and gate geometrical arrangements.

This relationship is shown by the graph in FIG. 4 where the $R_{on}A$ product for each of the layouts in FIGS. 1C, 2, and 3A are plotted as a function of channel length L. The $R_{on}A$ product has been normalized by the factor $\mu C_{ox}(V_{GS}-V_T)$ and the assumption has been made that the layout rules permit $w_c=5$ μm and $d=6$ μm. The result shown by these equations in FIG. 4 is that the triangular mesh, i.e. the densely packed hexagonal matrix structure of FIG. 3A, has the smaller $R_{on}A$ product when the channel length becomes relatively small, a situation indicated above to be most desirable. This is, of course, achieved with the size of the source and drain regions having been chosen no more than reasonably large enough to meet the limitations in the fabrication process typically used in manufacturing monolithic integrated circuits.

Of course, since monolithic integrated circuit layout rules for minimum spacings will tend to dictate the relative minimum size of each unit cell for each of the layouts in FIGS. 1C, 2, and 3A, practical layouts may not be able to achieve the full potential reduction in the RA product for a given one of these symmetry group solutions to the minimization problem above. Thus, there is a possibility, for instance, that the four-fold symmetry group represented in the FIG. 2 layout might possess a lower $R_{on}A$ product in practice than does the six-fold symmetry group structure represented in FIG. 3A, even for a relatively small channel length, despite the relationships of FIG. 4. Thus, necessarily, any relative result among the foregoing solutions must be examined by a simulated or an actual test structure before choosing among them.

For instance, the foregoing analysis of the FIGS. 1C, 2, and 3A arrangements has proceeded on the assumption that, in each instance, the interconnection means for electrically interconnecting the source and drain regions can be ignored in the analysis. If this is not the case, possibly because the minimum spacing rules might require, for one layout as opposed by the others, an interconnection means, having relatively thin leads therein leading to a relatively high interconnection means resistance. Then the relative merits of two layouts, such as the FIGS. 2 and 3A layouts, might be just reversed from that concluded in the above analysis. However, in both theory and practice, the triangular mesh layout of FIG. 3A has proved to have a smaller surface area in the monolithic integrated circuit for a given "on" condition channel resistance than does the perpendicular lines-of-center grid layout of FIG. 2. In fact, the interconnection means resistance can even be relatively lower in the triangular mesh layout of FIG. 3A than in the perpendicular lines-of-center grid layout of FIG. 2.

Figure 5:
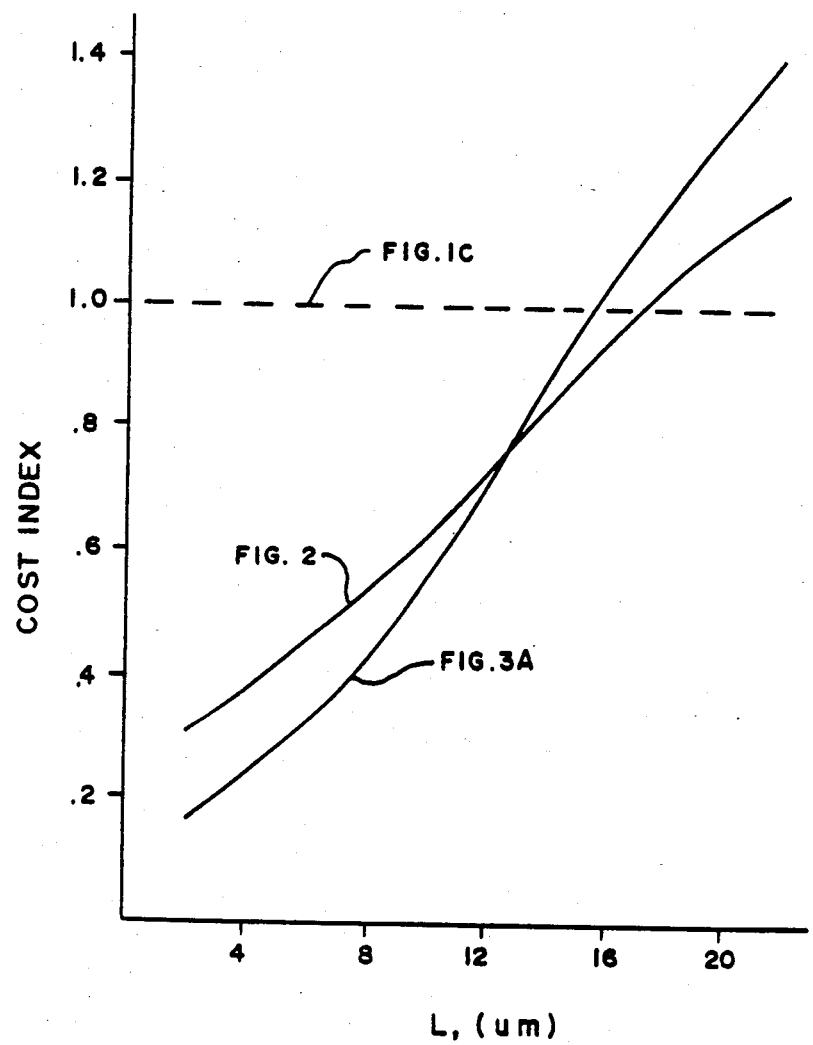
FIG. 5 shows a graph of estimated relative costs of three field-effect transistor device source, drain and gate geometrical arrangements.

Earlier, the relationship was noted that cost was typically proportional to the square of the area taken up in the major surface in a monolithic integrated circuit. FIG. 5 shows a plot of relative costs in terms of indices, the plot being made on the basis of the repeated stripe layout of FIG. 1C being the base cost. Note that the selection of the least cost layout clearly depends on the channel length chosen in connection with a particular layout for fixed values of $w_c$ and d. For a channel length of 7.5 $\mu$m, the perpendicular lines-of-centers grid of FIG. 2 can be expected to cost approximately 50% of the cost of the repeated stripe layout of FIG. 1C while the triangular mesh layout would be expected to cost but 37% of the FIG. 1C layout. Again, these costs assume that analysis used in the above equations is not compromised in practice by layout rules leading to relatively high resistance interconnection paths for one layout as opposed to the other.

Figure 3B:
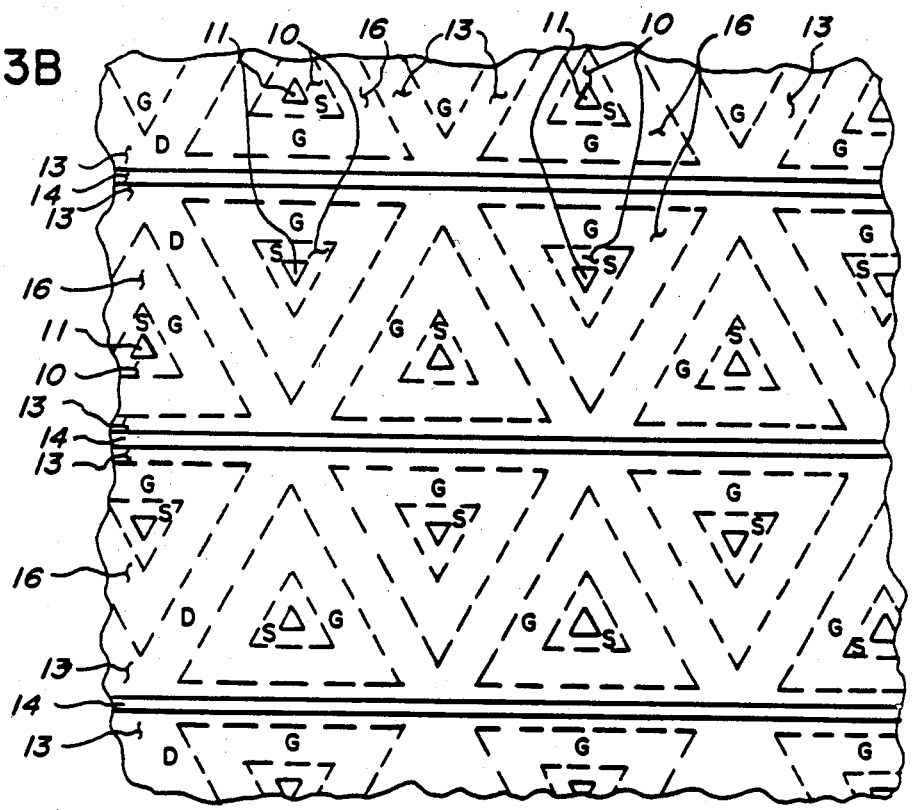

An alternate field-effect transistor device, also based on use of a densely packed hexagonal matrix structure, is shown in FIG. 3B. This version can also provide a both low "on" condition channel resistance and a low resistance in the metallization runs of the source and drain interconnection means, respectively. Further, the metallization shown in FIG. 3B can be provided in the pattern shown more easily than the pattern for the version shown in FIG. 3A in at least some metallization processes.

In the arrangement of FIG. 3B, the source region triangular surface portions 10 are within, and coincide with, the triangular gate surface portions 16. The drain region mesh surface portions 13 form a mesh pattern having triangular openings wherein the source and gate region surface portions are contained. Thus, latter regions are densely packed in a hexagonal matrix structure in the surface of the device shown in FIG. 3B, where the regions just mentioned are provided below a passivating layer covering the device.

FIG. 3B has source regions 10 again marked with a S and drain region 13 again marked with a D. Finally, gate regions 16 are again marked with a G. The solid line, and smallest, triangles represent openings in the insulating layer where electrical contact would be made to source regions 10 by the source interconnection means. The parallel solid lines define openings in the insulating layer where electrical contact would be made to drain region 13 by the drain interconnection means. A further layer of interconnection means is required to electrically interconnect gate regions 16. Openings for such connections are not shown in FIG. 3B.

Figure 3C:
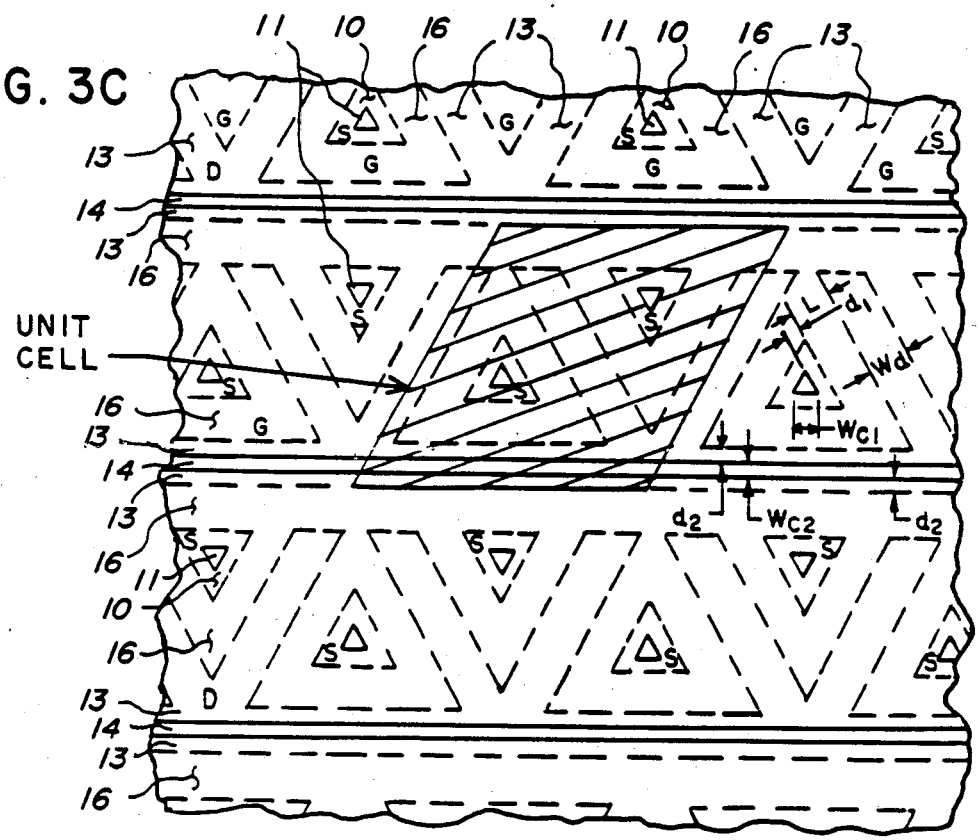

To avoid needing another interconnection means layer for electrically interconnecting the separated gate regions shown in FIG. 3B, the structure of FIG. 3C can be used to join, in the semiconductor material, the gate regions around the source region to thereby form a plurality of rows of joined gate regions. This provides the possibility of a single contiguous gate region in the semiconductor material if these rows are also joined in the material, or if not, at least no gate interconnections are required beyond those needed for interconnecting the rows. Other than the interconnecting of gate regions 16 in the semiconductor material in FIG. 3C, the structure shown in this figure is substantially that shown in structure in FIG. 3B.

The choice of what is designated as source regions 10 in FIGS. 3B and 3C—the region having triangular surface portions—as opposed to choosing drain regions to have triangular surface portions is arbitrary. That is, the regions 13 marked with a D and the regions 10 marked with a S could have these markings interchanged so that the drain regions are the triangular surface portions and so that the source regions form a mesh surface portion surrounding the gate and drain triangular surface portions, respectively.

Choosing the structure shown in FIG. 3C for analysis, a unit cell has been shown there of the same nature and in the same manner as the unit cells shown in each of FIGS. 1C, 2, and 3A. The $R_{on}A$ product for the layout of FIG. 3C then is given as follows:

$$(R_{on}A)_{FIG.\ 3C} = \frac{L\left[3L + 3d_1 + 2d_2 + \frac{(3)^{\frac{1}{2}}}{2} w_{c1} + w_{c2}\right]}{\mu C_{ox}6[2(3)^{\frac{1}{2}}L + 2(3)^{\frac{1}{2}}d_1 + w_{c1}](V_{GS} - V_T)} \cdot$$

$$\left[2(3)^{\frac{1}{2}}L + 2(3)^{\frac{1}{2}}d_1 + w_{c1} + \frac{4}{(3)^{\frac{1}{2}}} w_d\right].$$

In these equations L again represents the distance across the gate region while $w_d$ represents the width across the drain region arm. The symbols $w_{c1}$ and $w_{c2}$ are the contact opening dimensions for source regions 10 and drain regions 13, respectively. The distances $d_1$ and $d_2$ represent distances remaining in the source and drain regions outside the associated contact openings, respectively.

If the analysis of this last equation is pursued, one finds that the performance of the structure in FIG. 3C is approximately that of the structure shown in FIG. 3A with respect to the performance of the structure shown in FIG. 1C. Hence, the densely packed hexagonal matrix structure of FIG. 3A is approximately equal in the device performance to the structures shown in FIGS. 3B and 3C.

Figure 6:
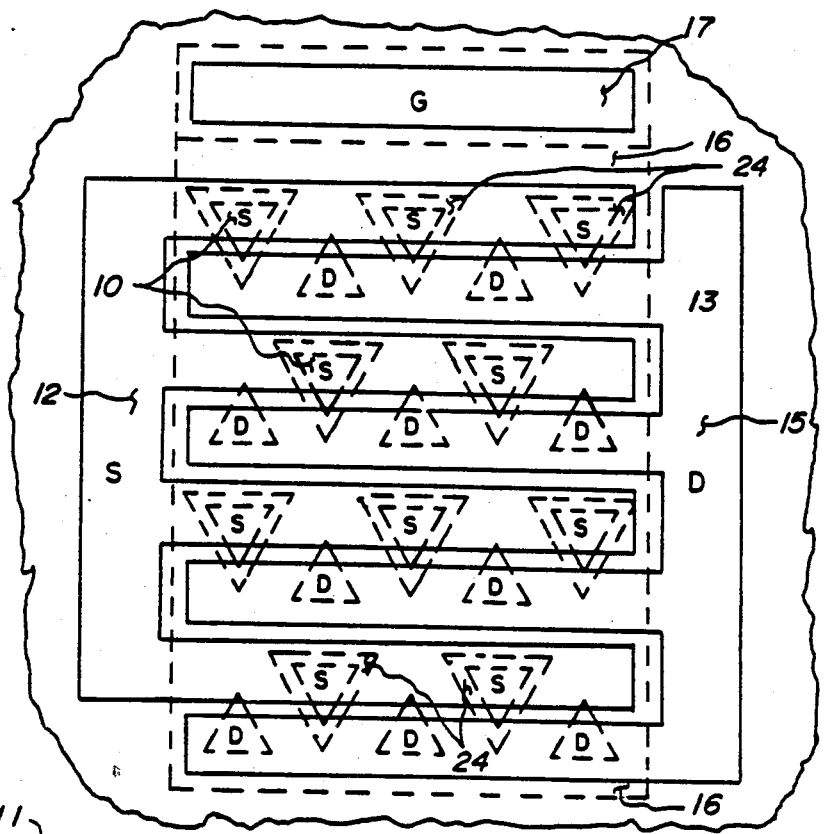
FIG. 6 shows a field-effect transistor device.

FIG. 6 shows a top view of a field-effect transistor device of the present invention, related to FIG. 3A, without a passivating layer present over the source and drain interconnection means. Although the triangular surface portions resulting from the intersection in the semiconductor material body major surface of several source and drain regions are shown in FIG. 6, the few shown there should not necessarily be taken as being indicative of the number of source and drain regions which will be provided in the actual usable device. Rather, the number presented reflect the size which can be conveniently accommodated in the drawing. In actual use, there will usually be thousands of such triangular surface portions, often exceeding 50,000 in number.

The source interconnection means 12, typically formed with aluminum metal, is marked with a S as found in FIG. 1A. The drain interconnection means 15, again typically aluminum metal, is marked with a D as is also true in FIG. 1A.

The gate contact opening, 17, is marked with a G. The extension from gate contact opening 17 over the gate portions of the field-effect transistor device is again designated by 16, as in FIG. 1A, and includes the entire dashed line rectangle so marked but substantially excluding those portions over the triangular surface portions involving the source and drain regions. In a JFET, region 16 represents portions of the semiconductor body material which are of a conductivity type opposite that found in the source and drain regions. Region 16 could also be, in this instance, a conductor over, and making contact to, such JFET gate regions used when the gate resistance is to be minimized. In a MOSFET, region 16 represents gate conductive material on an underlying insulating layer, usually silicon dioxide, which separates the semiconductor material body and the gate conductive material layer 16. Typically, in this instance, the region 16 gate conductive material is either of polysilicon or of metal. Polysilicon would be chosen for the most compact design because the layout spacing rules can be tightened because there is less chance with polysilicon of shorts to the overlying metal layers involving the source and drain interconnection means. However, a metal for gate 16 would be chosen when fast switching speed is the primary desire because there is less lead resistance when metal is used therefor.

The triangular surface portions 10 in the major surface of the semiconductor material body due to the intersecting source regions, shown under a silicon dioxide insulating layer, are again each marked with a S in FIG. 6 as the source region was in FIG. 1A. The triangular surface portions 13 due to the drain regions are each marked with a D as was the drain region in FIG. 1A. A further passivating layer, typically of doped silicon dioxide, would also be provided over the structure shown in FIG. 6 but has been omitted here for clarity.

Figure 7:
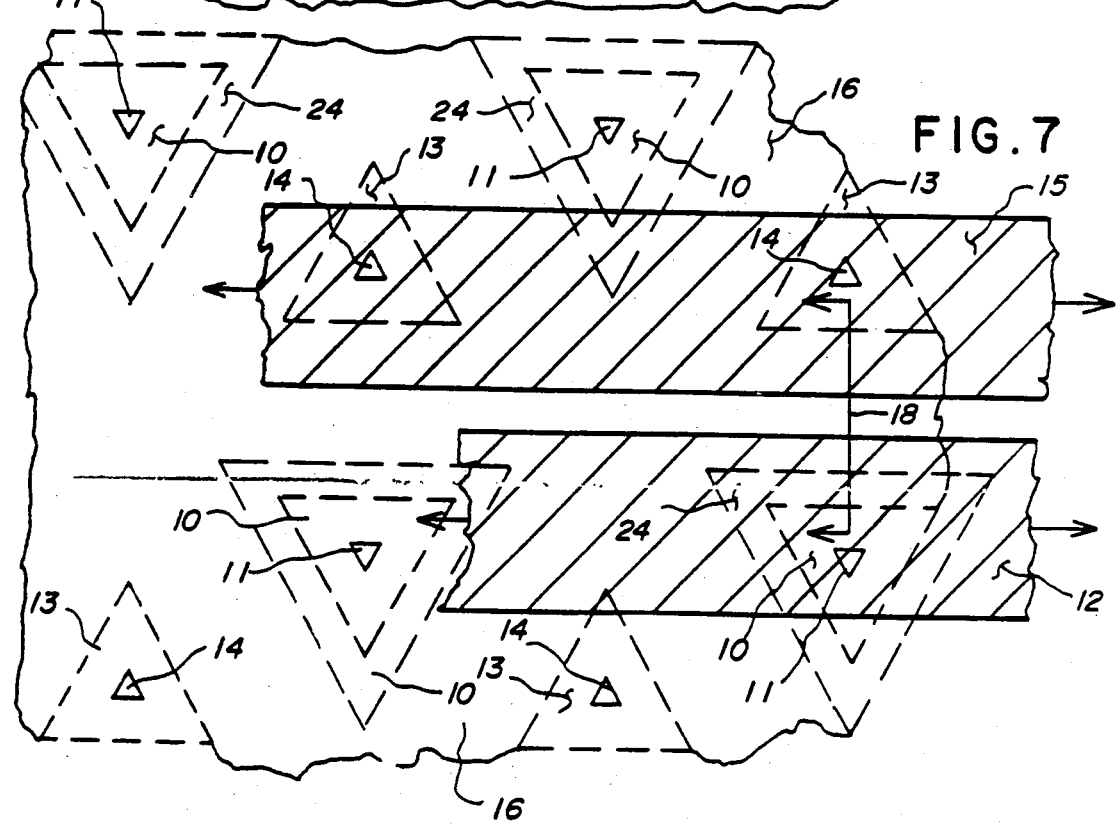
FIG. 7 shows a portion of the field-effect transistor device of FIG. 6.

The portion of FIG. 6 contained in the closed wavey line is shown again, for the most part, in FIG. 7 for a MOSFET device. The same numeral designations are retained in FIG. 7 as have been used in FIG. 6. Contact cuts through the insulating layer disposed between the source and drain interconnection means and the semiconductor material body to accommodate electrical contacts to the source and drain regions below by these interconnection means are shown on FIG. 7. These contact cuts are identified in FIG. 7, as they were in FIG. 1A, as source contact cuts 11 and drain contact cuts 14.

Figure 8:
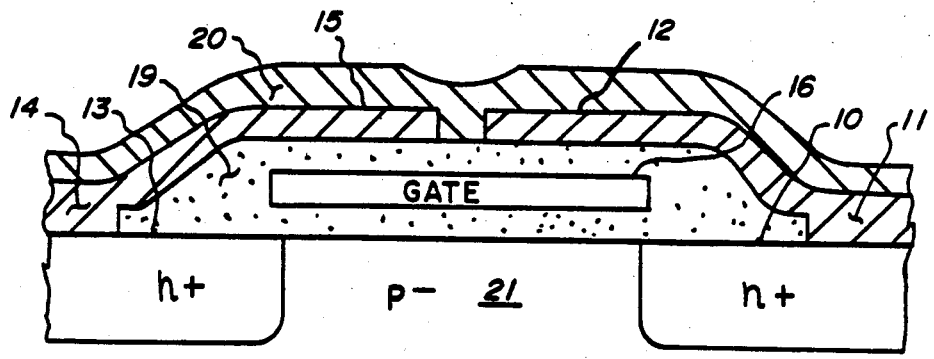
FIG. 8 shows a cross section of a portion of one version of the field-effect transistor device of FIG. 7.

A section line, 18, is shown in FIG. 7 and the corresponding section portion is shown in FIG. 8. Again, the same numerals have been retained in FIG. 8 as were used in FIGS. 6 and 7. A phosphosilicate glass passivating layer, 20, has been added in FIG. 8 which is not present in FIGS. 6 and 7. A silicon dioxide insulating region, 19, protects the gate and separates it from the semiconductor material body major surface.

The n-type conductivity drain region associated with th triangular surface portion 13 is typically provided by a phosphorus dopant through diffusion or implantation in the silicon semiconductor material body, 21, where the dopant reaches the concentration of approximately $10^{18}$ atoms/cm$^3$. The source region associated with surface portion 10 is similarly provided. The semiconductor material body outside of the source and drain regions is typically of p-type conductivity due to a boron dopant therein to the extent of approximately $2 \times 10^{15}$ atoms/cm$^3$. A typical spacing between the source and drain regions, as indicated earlier, would be 7.5μm. A typical separation between the semiconductor material body in 21 and the gate would be 1,000 ÅA.

An MOS device can be built somewhat differently than shown in FIG. 8 by having the gate 16 remain as shown but having the source region 10 and the drain region 13 provided by a doped polysilicon deposition on the major surface of the semiconductor material body immediately adjacent the gate. In this situation, there would not be substantial doped regions provided in the semiconductor material body to serve as source and drain regions.

Figure 9:
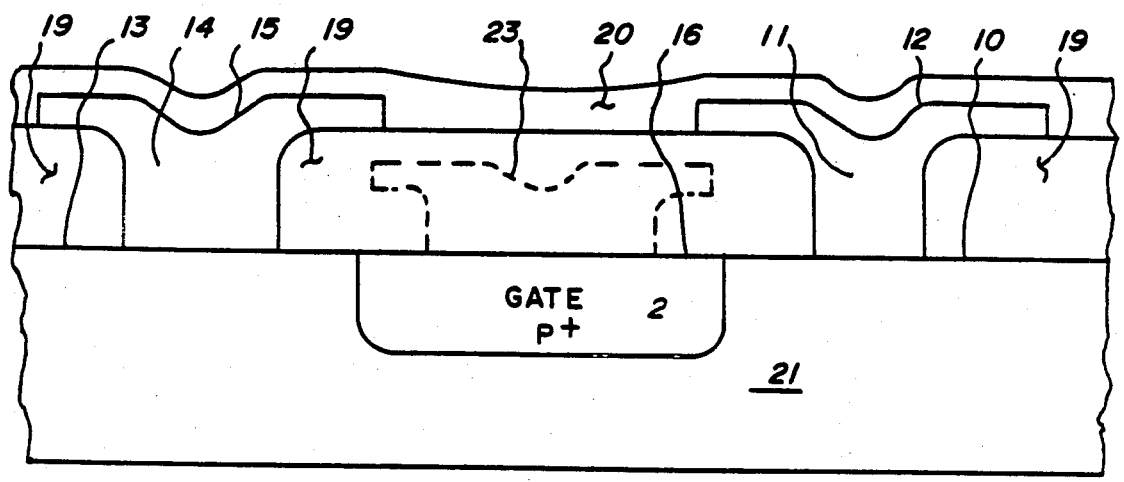
FIG. 9 shows the cross section of a portion of another version of the field-effect transistor device of FIG. 7.

FIG. 9 shows the JFET configuration corresponding to FIGS. 6 and 7, again retaining the same numeral designations for common or similar structural portions. Now, however, the semiconductor material body 21 represents an n-type conductivity silicon epitaxial layer doped with $10^{15}$ atoms/cm$^3$ of phosphorus, formed over a p-type conductivity silicon substrate, 22, doped with $5 \times 10^{14}$ atoms/cm$^3$ of boron. Layer 21 contains the source and drain regions forming the triangular surface portions at its major surface. These source and drain regions partly surround the gate region 16 so that then drain and source regions are continuous below gate region 10, i.e. are contiguous with one another. Gate region 16 is formed by doping with boron to the extent of $10^{18}$ atoms/cm$^3$.

Another layer of metal, 23, is shown in FIG. 9 by dashed lines as a gate electrical connector to the gate region 16 surface which, in ohmic contact with the surface of region 16, could alternatively be used to reduce gate resistance rather than using the gate region in the semiconductor body as the sole gate interconnection means. If the region in layer 21 serving as the gate region were eliminated, metal layer 23 in rectifying contact with layer 21 would serve to define the gate region 16 in a Schottky barrier field-effect transistor device.

As indicated in the foregoing, a desirable field-effect transistor device will not only have a low "on" channel resistance, but also, the device must be able to stand a substantial voltage between the effective drain and the effective source, (punch-through voltage) and between the effective drain and the substrate (breakdown voltage), when the device is in the "off" condition. This is particularly true for field-effect transistor device used as switches or controllers in power circuits involving substantial voltages.

To obtain a substantial punch-through voltage capability, one could, of course, increase the effective channel length of the device. However, this has substantial disadvantages, as indicated above, in connection with the "on" condition channel resistance and the switching speed. Further, this expedient does little to improve the breakdown voltage acros the drain-to-substrate pn junction. This breakdow voltage is affected by the doping levels occurring in the source and drain regions partly which determines the immobile charge electric field contribution to breakdown, and by the resulting geometrical shapes of these regions in that curvature thereof can significantly increase the effective electric field for a given potential to thereby hasten the onset of breakdown.

Further, the gate region can considerably modify the punch-through and breakdown voltages from what they would be in the absence of this gate region. These modifications are due to such phenomena as hot carrier injection into gate insulating layers, concentration of surface field lines by the conductive gate, anamolous surface conduction under the gate, etc.

Figure 10:
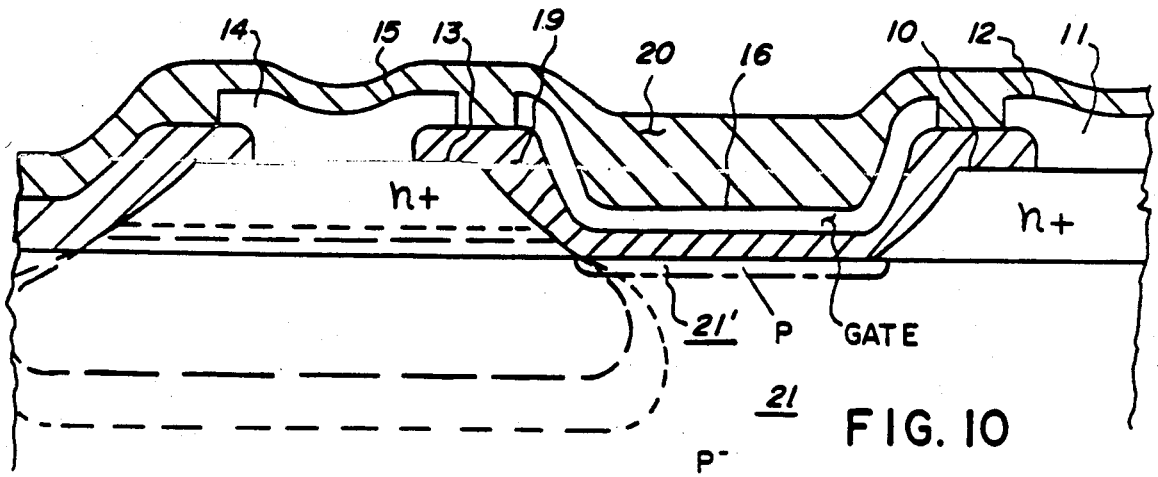
FIG. 10 shows a cross section of a portion of a version of a field-effect transistor device that can withstand a substantial reverse bias voltage.

FIG. 10 shows a MOS device structure alleviating the punch-through voltage and breakdown voltage problems. The device of FIG. 10 is to be taken as representing the cross section of either an individual MOS field-effect transistor device of a field-effect transistor device having multiple sources and gates. In this latter instance, FIG. 10 is thus a somewhat wider version of cross section 18 of FIG. 7, a figure taken from part of FIG. 6 and related to FIG. 3A. Passivating layer 20 has been added in FIG. 10 as in FIGS. 8 and 9 which also show cross sections taken from FIG. 7.

In FIG. 10, however, the source and drain region leading to triangular surface portions 10 and 13, respectively, are no longer formed in the semiconductor material body, but rather are formed on the major surface of the semiconductor material body by deposits of doped polysilicon. The channel of the MOS field-effect transistor device of FIG. 10 will again occur in the semiconductor material body 21 through inversion occurring in this semiconductor material below the gate 16. This channel will then form between the source and drain doped polysilicon deposits.

The silicon semiconductor material body 21 is of p-type conductivity through being doped by boron atoms to the extent of approximately $2 \times 10^{15}$ atoms/cm$^3$. A threshold voltage adjust region, 21', of higher boron doping at the body 21 major surface, typically $2 \times 10^{16}$ atoms/cm$^3$ may be provided, usually by implantation, to adjust the threshold voltage of the resulting field-effect transistor. This region may also be selected to be provided in some of the previously discussed devices. The polysilicon source and drain regions leading to the triangular surface portions 10 and 13, respectively, (in the multiple source and drain region device laid out in a hexagonal matrix densely packed structure of FIG. 10), are of n-type conductivity through doping by phosphorus to the extent of $10^{18}$ atoms/cm$^3$. The gate 16 can again be of doped polysilicon or of metal. The doped polysilicon drain and source regions are typically 0.3 to 0.4μm thick and separated by typically 4μm. The tapered portions of these regions are at least 1μm in extent along the surface of semiconductor layer 21, and preferably 2μm. Silicon dioxide layer 19 is typically 2,000 Å. Other parameter voltages are possibly subject to the criteria discussed below.

Of course, the FIG. 10 cross section can also represent either a discrete field-effect device or one in a monolithic integrated circuit having other transistors or types of transistors therein. This device could also be used in connection with the layout of FIGS. 1, 2, 3B or 3C in a monolithic integrated circuit as well as with the layouts of FIGS. 3A, 6, and 7.

When in the "off" condition, a substantial positive voltage, i.e. reverse bias voltage, will be on drain region 13 leading to the depletion regions outlined by the dashed lines in FIG. 10. A smaller reverse bias voltage provides the depletion region contained within the long dashed lines in FIG. 10 and a larger reverse bias voltage leads to the larger depletion region contained within the short dashed lines. First, the structure of FIG. 10 will increase the minimum voltage leading to punch-through between the depletion regions around both drain region 13 and source region 10, respectively, resulting from the merging of these depletion regions. This is because of the abrupt nature of the boundary or edge of doped polysilicon drain region 13 at its terminating edge next to the channel which requires that the depletion region portion in the semiconductor material layer 21 to begin essentially at this edge to maintain equal immobile charge on both sides of the metallurgical junction in the depletion region.

This equal charge maintenance requirement and the relatively long extent of relatively heavily doped source region 13 also means that increases in the depletion region extent with increasing reverse bias voltage will occur mostly perpendicular to the surface of semiconductor material layer 21 with very little increase parallel thereto. That is, any increase in the depletion region extent perpendicular to the surface of semiconductor material layer 21 will include so much more immobile charge to balance the added immobile charge in the depletion region occurring in drain region 13 that little further increase in the layer 21 depletion region parallel to its surface is required. Further, any increase in the depletion region extent in drain region 13 occurs in a portion thereof relatively remote from the boundary thereof because of the tapered edge nature of this source region. The source region 10 is usually of similar construction.

Not only is there an improvement in the minimum punch-through voltage in using the structure of FIG. 10, but also there is an improvement in the breakdown voltage of the pn junction between the doped polysilicon drain region 13 and the semiconductor material body 21 serving as a substrate. This improvement in the breakdown voltage depends directly on the length and thickness, i.e. the taper, of the tapered edge of the drain region 13 as shown in FIG. 10. If the terminating edge of drain region 13 were a planar boundary perpendicular to the surface of semiconductor material layer 21, there would be a relatively sharp angle in the depletion region boundary at the point the doped polysilicon deposit of drain region 13 meets this surface because of the extension, though smaller, of the depletion region in layer 21 parallel to this surface. Such an abrupt geometrical change in the depletion region leads to a relatively high gradient of the voltage being dropped across the depletion region at the point of the sharp change which means a relatively high electric field at this point for a given voltage leading to a relatively low breakdown voltage. On the other hand, drain region 13 with its tapered terminating edge does not introduce a sharp angle into the depletion boundary and so no substantial gradients result. Thus the breakdown voltage is not too different from that associated with a plane junction.

A further advantage of the structure shown in FIG. 10 is that the edge of the depletion region in drain region 13 comes out from beneath effective portions of gate 16 for large reverse bias voltages on drain region 13. This leads to higher breakdown voltages by eliminating or reducing some of the problems described above in connection with the mention of the gate modifying breakdown voltages. Thus, the doping distributions in the polysilicon deposit of drain region 13 and of semiconductor material layer 21, the extent of the tapered portion of drain region 13 under effective portions of gate conductor 16, and the thickness of gate insulating layer 19 should be chosen so that the drain depletion region extends through those portions of drain region 13 under the effective portions of gate conductor 16 prior to breakdown occurring.

The structure of FIG. 10 allows the use of any crystallographic plane as a major surface of semiconductor body 21 so that a high carrier mobility in that particular crystallographic orientation can be obtained. This is in contrast to V-MOS devices where the need for etching the V-groove limits the crystallographic orientations which can be used and results in crystallographic orientations for the channel that have a lower carrier mobility and, hence, higher "on" condition resistance and longer switching time.

The structure of FIG. 10 can be provided with use of simple processing requiring no high temperature steps since no diffusions are involved. That is, the doped polysilicon can be deposited by an evaporation process without any need for high temperatures and there is no other doped regions to be provided in or upon the already doped semiconductor material 21.

The cross sections shown in FIGS. 8, 9, and 10 would be approximately the same, if properly chosen, for figures related to FIGS. 3B and 3C as FIGS. 6 and 7 are related to FIG. 3A. That is, the change in geometrical arrangement in going from FIG. 3A to FIGS. 3B or 3C would not require substantial fabrication process changes.

Figure 11:
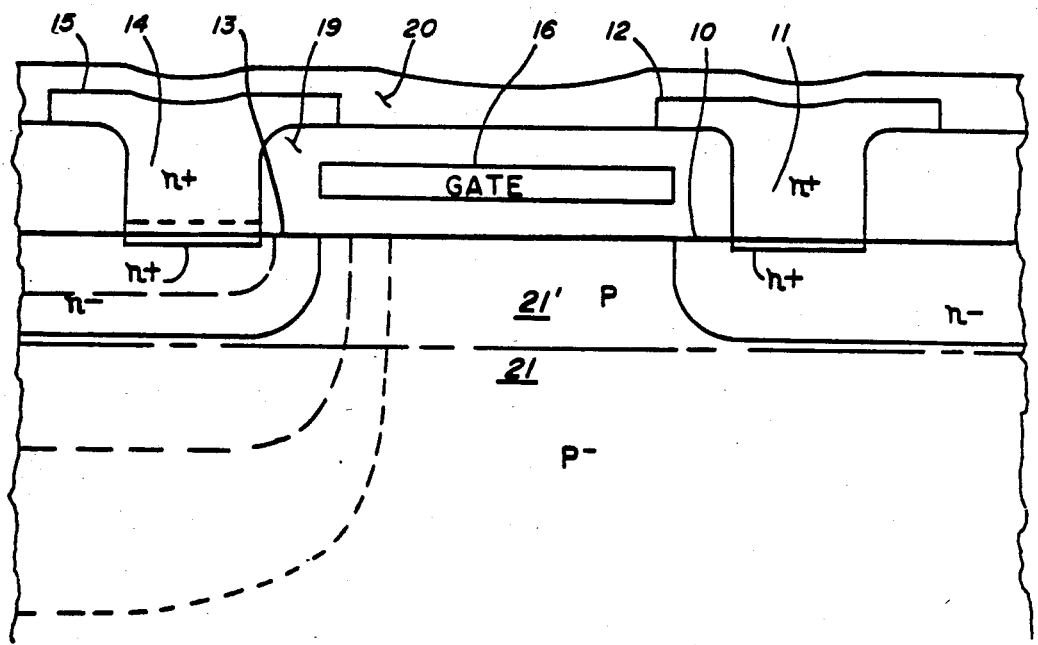
FIG. 11 shows a cross section of a portion of another version of a field-effect transistor device that can also withstand a substantial reverse bias voltage.

The structure of FIG. 10 requires the doped polysilicon source region 10 and drain region 13 have a tapered termination edge spread—to a distance of one and preferably two microns—over a substrate structure, a situation which can present difficulties in fabrication for some fabrication processes. FIG. 11, on the other hand, shows an alternative MOS field-effect device which also provides high minimum punch-through and breakdown voltages. The structure of FIG. 11 is again to be taken as representing a cross section of either an individual MOS field-effect transistor device or of a portion of a MOS field-effect device having several source and drain regions. Thus, again, the FIG. 11 cross section can be a wider version of cross section 18 in FIG. 7 if a passivating layer was added in this latter Figure, and so of FIGS. 6 and 3A. Similarly, FIG. 11 may be a cross section of a device represented by FIGS. 2 or 3B or 3C if drain and source interconnection means and a passivating layer were added to these latter figures.

The MOS field-effect transistor device of FIG. 11, in contrast to the structure of FIG. 10, has source region 10 and drain region 13 formed in the semiconductor material body 21. However, the doping level in regions 10 and 11 are extremely low so that when the MOS field-effect transistor device is in the "off" condition, with a large reverse bias on the drain-substrate pn junction (meaning in FIG. 11 that drain region 13 is positive with respect to the substrate, i.e. other portion of semiconductor material body 21) that drain region 13 is completely depleted of charge carriers prior to avalanche breakdown of the drain-substrate pn junction. As a result, the drain region side of the depletion region around the drain-substrate junction extends into drain interconnection means 15 for sufficient reverse bias voltage. A similar result would be obtained at source region 10.

By ensuring that source region 10 and drain region 13 each do not contain sufficient impurity doping to reach a critical electrical field prior to complete depletion under reverse bias, the breakdown properties become determined essentially by a depletion region spread over a relatively long path over the metallurgical junction involved and by the conditions existing around the electrical contact means made to these regions. This situation, to a substantial extent, removes the influence of gate 16 from affecting breakdown and limits the lateral extent of the depletion region on the substrate side of the metallurgical junctions.

To assure these conditions exist, the structure of FIG. 11 uses highly doped polysilicon source interconnection means 12 and highly doped polysilicon drain interconnection means 15. Providing the interconnection means or electrical contacts in operations subsequent to providing regions 10 and 13 also leads to a slight diffusion into regions 10 and 13 shown just below the interface between the semiconductor material body 21 and these interconnection means. The depth of this diffusion is very shallow, approximately $0.1 \mu m$ or less, and does not have a significant effect on the behavior of regions 10 and 13 under reverse bias conditions.

The doped polysilicon n-type conductivity source and drain interconnection means 12 and 15, respectively, are doped with phosphorus to the extent of $10^{18}$ to $10^{19}$ atoms/cm$^3$. The phosphorus doping level concentration in the n-type conductivity source and drain regions 10 and 13, respectively, in semiconductor material body 21 is approximately of the order of 0.1 to $4 \times 10^{16}$ atoms/cm$^3$. This is provided by an ion implantation step discussed below using a carefully controlled dose. The (i) high doping level of the doped polysilicon electrical contacts, and the (ii) low doping level of the source and drain regions, leads to the extending of the contact depletion region portions—those on the electrical contact side of the pn junctions around the source and drain regions, respectively—into the source and drain interconnection means very soon with increasing reverse biasing voltage on these pn junctions. The doping level of semiconductor material body 21 is of a p-type conductivity and is due to boron atoms being present in the, typically, silicon material thereof in a concentration less than approximately $5 \times 10^{15}$ atoms/cm$^3$.

A threshold voltage adjust region, 21', also of p-type conductivity, may or may not be provided in semiconductor material body 21 immediately adjacent to the major surface of this body. This region is shown by an alternately long and short dash in a dashed line in FIG. 11. If provided to adjust the threshold voltage of the resulting MOS field-effect transistor, the region would usually be fabricated by implanting boron atoms reaching a concentration of typically around $2 \times 10^{16}$ atoms/cm$^3$. The depth of threshold adjust region 21' below the major surface of body 21 may be less than, equal to, or exceed the depth of the source and drain regions 10 and 13, The effects of increasing reverse bias voltage on the drain-substrate pn junction, i.e. an increasing positive voltage applied to the drain interconnection means 15 in FIG. 11 with respect to the substrate, are shown by the dashed lines displayed in that figure. For low reverse bias voltages, a pair of long dashed lines on either side of the solid line depicting the metallurgical pn junction, separating the drain region 13 from the remainder of the semiconductor material body 21, represents the limits of the depletion region in this condition. That is, the depletion region occurs entirely within the semiconductor material body 21.

Since the immobile charge within the depletion regions on either side of the drain-substrate metallurgical junction must be equal, the depletion region around the curved portion of the pn junction extends less far into the channel region of the semiconductor material body 21 than it does into the drain region 13. This is because the receding of the depletion region boundaries from the pn junction with increasing reverse bias will more quickly include additional immobile charges in the depletion region on the semiconductor material body 21 side of the pn junction than on the drain region 13 side because of the greater radius of curvature of the depletion region boundary on the body side of the junction as opposed to the radius on the drain side of the junction. Thus, the depletion region will not extend into the channel region as rapidly and the punch-through voltage minimum will be increased.

For a higher reverse bias voltage on the drain interconnection means 15, the short dashed lines in FIG. 11 result. The depletion region boundary on the drain region 13 side of the metallurgical pn junction has now receded into the doped polysilicon interconnection means 15. Again, there has been relatively little increase in the depletion region limit on the substrate side of the pn junction into the channel, but rather the increase in the depletion region on the substrate side goes deeper into the substrate body. This is based on the fact that little more immobile charge is being uncovered by increasing reverse bias voltage in the drain interconnection means 15 in the direction parallel to the major surface of the semiconductor material body 21 (no further immobile charge is uncovered in region 13 as it is completely depleted). Consequently, to maintain equal amounts of immobile charge in the depletion region on both sides of the metallugical junction, little more immobile charge is uncovered on the substrate side in the channel region along this same direction with the increasing reverse bias voltage.

This being so, very short channel lengths can be used for the MOS field-effect transistor device of FIG. 11 without encountering punch-through. This use of short channel lengths, as indicated earlier, lowers the "on" condition channel resistance and reduces the semiconductor material body major surface area taken up by the device.

There is also a substantial improvement in the breakdown voltage minimum because in the condition shown by the pair of short-dashed lines in FIG. 11, the depletion region on the drain 13 side of the drain-substrate pn junction has receded into the drain interconnection means 15. While there is some curvature of the electric field in this geometry, the reverse bias voltage applied to the drain interconnection means 15 is spread over a substantial longer depletion region having less concentrated exposed immobile charge by virtue of the use of the lightly doped drain region 13 leading to a lower electric field for a particular reverse bias voltage. Further, with the boundary of the drain portion of the depletion region in the drain interconnection means 15, the influence of the gate 16 on breakdown is much reduced. Thus, the FIG. 11 structure obtains improved minimum punch-through voltages and breakdown voltages, but in a manner not requiring the forming of a long, thin tapering doped polysilicon region to serve as the source and drain regions.

For the structures of both FIGS. 10 and 11, the avoidance of a substantial doping diffusion step to provide heavily doped source and drain regions in the semiconductor material body present, as is typically done, allows closer spacing of the effective portions of the gate conductor to the source and drain interconnection means contacts. This is so because no sideway, or lateral, diffusion of the source and drain regions need be allowed for in the packing of the MOS field-effect device in the major surface of the semiconductor material body. That is, in FIG. 10, the source and drain interconnection means are provided by a deposition of doped polysilicon and no further structure is provided in the semiconductor material body 21 which could diffuse laterally. On the other hand, in FIG. 11, the lightly doped portions of the source and drain regions in the semiconductor material body 21 may be provided through ion implantation which will self-align with gate conductor 16. This means that only a relatively small area in the semiconductor material body major surface need be used in forming a MOS field-effect device. This closer source and drain contact spacing with respect to the gate, permitting reduced distances across the device between the source and drain contacts, will tend to offset the somewhat larger distances involved between the effective source and drain, on the one hand, and the effective gate portions on the other, due to having the contacts serve as the effective source and drain regions.

Because of the importance of having the proper doping level in both (at least where more or less symmetrical capabilities are desired) the source region 10 and the drain region 13 of FIG. 11, to assure that depletion therein occurs prior to breakdown of the pn junction separating these regions from the remainder of the substrate, the doping requirements for these regions must be relatively precisely met. Rather than a concentration level alone being the criteria, the total number of net impurity atoms per unit area provided in the semiconductor material body below the portions of th semiconductor material body major surface intersected by the source and drain regions is to be controlled. That is, the ion implantation net dose must be controlled, i.e. the integral of the concentration over depth in the semiconductor material body must be controlled, so that the excess of phosphorus atoms in either drain region 13 and in source region 10 over the boron dopant atoms in region 21' (or in substrate 21' if no differentiated region 21' is provided) is due to a dose of less than approximately $1 \times 10^{13}$ atoms/cm$^2$.

Whether the proper doping levels for the source and drain regions of FIG. 11 has been achieved can be determined by checking that the drain regions, for instance, are completely depleted when reverse biased without the junction being in breakdown, which will require the application of a reverse bias voltage of between 25 and 35 volts. On the other hand, for a p-channel deivce, the drain-substrate pn junction should completely deplete without the junction being in breakdown when subjected to a sufficient reverse bias voltage which will be between approximately 80 and 90 volts. In practice then, the breakdown voltage across, for instance, the drain-substrate pn junction in devices satisfying these requirements, will be found to be around 200 volts or more with the substrate and source commonly grounded.

Using an implantation energy of 150 kv, the source regions 10 and drain regions 13 of FIG. 11 will be separated from the remainder of the semiconductor material body 21 by a pn junction being at a depth of approximately 1 $\mu$m below the major surface of the semiconductor material body 21. Source regions 10 and drain regions 13 will be separated from one another by approximately 2 to 4 $\mu$m below gate 16. Gate 16 can be either doped polysilicon or metal and will be separated from the major surface of semiconductor material body 21 by a portion of, typically, silicon dioxide of insulating material 19 usually about 2,000 ÅA thick.

Figure 12:
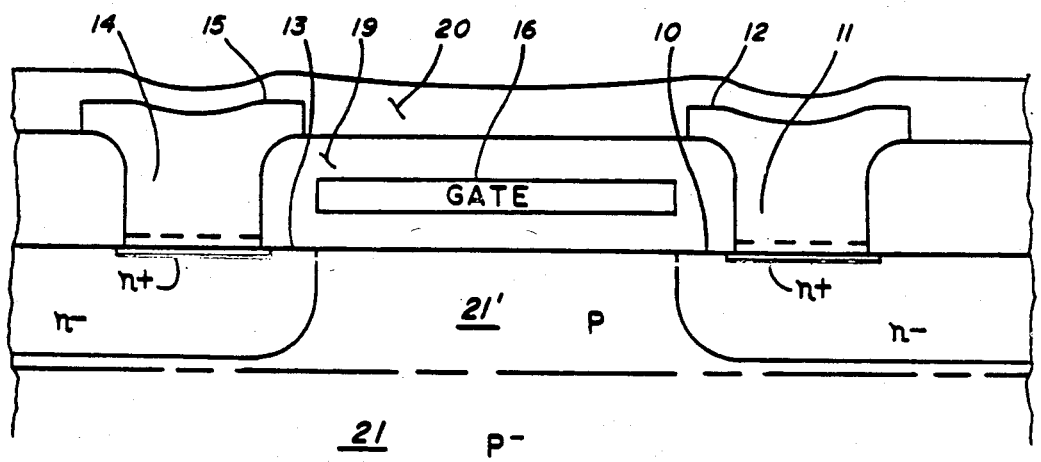
FIG. 12 shows a cross section of a portion of another version of a field-effect transistor device that can also withstand a substantial reverse bias voltage.

Doped polysilicon is not the only material which can satisfactorily be used for making the source and drain interconnection means of FIG. 11. An alternative is shown in FIG. 12 where the source interconnection means 12 and the drain interconnection means 15 are formed by the use of multiple metal layer contacts, the first contact shown there being platinum which is provided in a manner to form platinum silicide at the interface between the platinum and the very shallow $n^+$-type conductivity region implanted or diffused below these interconnection means in silicon semiconductor material body 21 (and in threshold adjust region 21' if present). In this arrangement, the regions marked in FIG. 12 $n^+$ are provided by ion implantation, and are very shallow, being less than 0.1$\mu$m below the major surface of semiconductor material body 21. Thereafter, various layers of metal on the platinum can be provided to form the interconnection means in one of the well known electrical contact structures for monolithic integrated circuits. Other interconnection means structures can be used with other materials such contacting the silicon with aluminum contacts or any other metallurgical arrangement which does not lead to spiking through the $n^+$ regions provided below these contacts.

The devices of FIGS. 11 and 12 increase breakdown voltages by forcing the resulting electric fields occurring in the "off" condition to be spread over a longer distance to thereby reduce field intensity at any of the points subject to the fields when these devices are in the "off" condition with either the source or the drain region withstanding the forcing voltage. A further way for reducing field intensity at either the source or the drain location is to have present some other or some further means for adhering the field. This can be accomplished by use of a field plate, or shield electrode, provided in the insulating material near the source or drain regions including the bounding pn junctions surrounding these regions in the semiconductor material. The use of such a shield electrode spaced in the insulating material the same distance from the semiconductor material body electrode material as the gate conductor, or gate region, is spaced therefrom does offer an improved voltage breakdown but not as much as having the shield electrode spaced somewhat further from the semiconductor material body.

FIG. 13 shows a first version of an alternative MOS field-effect device which again provides increased minimums for device punch-through and breakdown voltages using a shield electrode. Once again this structure with its variants, as shown in FIG. 13 (and subsequently in alternate versions in FIGS. 14 and 15) are to be taken as representing a cross section of either an individual MOS field-effect transistor device or of a portion of a MOS field-effect device having several source and drain regions. As a result, the cross section shown in FIG. 13 (and in FIGS. 14 and 15) can be versions of cross section 18 in FIG. 7, shown somewhat wider in FIG. 13, if a passivating layer was added in FIG. 7, and so a version of FIGS. 6 and 3A. Of course, the region marked 24 in FIGS. 6 and 7 for a D-MOS device are to be ignored here as they are to be ignored in FIGS. 10, 11 and 12. Such devices are not being discussed here. Again, the cross-section structures of FIG. 13 (and of FIGS. 14 and 15) may be cross sections of a device represented by FIGS. 2 or 3B or 3C if drain and source interconnection means and a passivating layer were added to these latter figures.

Figure 13A:
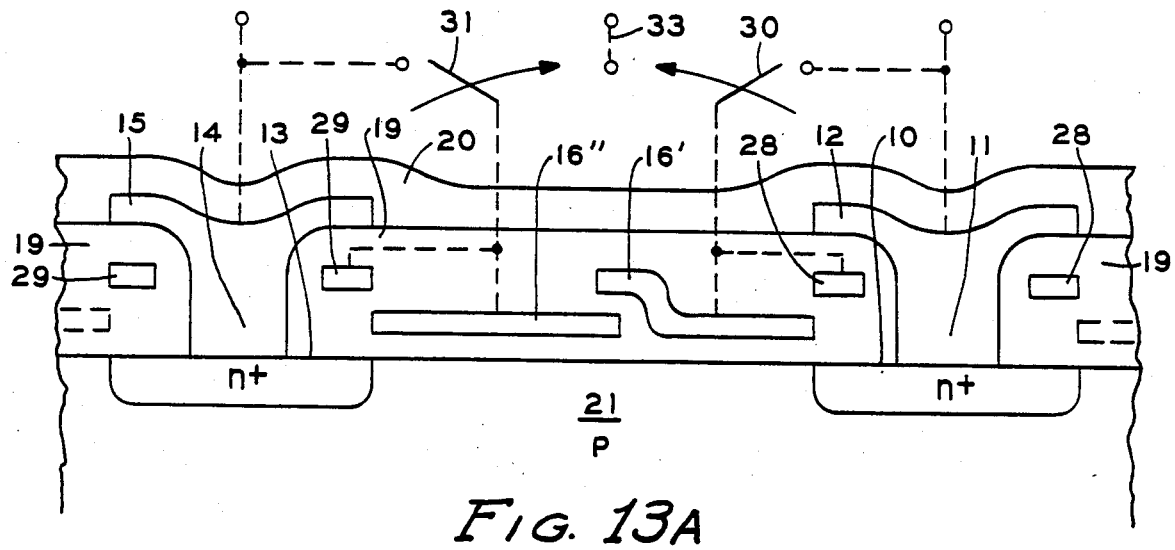

The MOS field-effect transistor device of FIG. 13A has a pair of terminating regions, 10 and 13, formed in semiconductor material body 21. These regions, of course, serve as a terminating region for what is intended to be the channel region in FIG. 13A appearing underneath what now is a split gate conductor 16, or split gate region. The components of this gate conductor are designated 16' and 16". Terminating region 10 will continue as source region 10 and terminating region 13 will continue as drain region 13, again, somewhat arbitrarily as though the device of FIG. 13A was being used in a direct voltage application. However, since the voltage polarity applied determines which of the regions 10 and 13 is actually serving as a source or a drain region in a circuit sense at any particular time during operation, these terminating regions may in practice serve as either a source or a drain region in a circuit sense. They will alternately be often serving as both in an alternating voltage circuit application.

Again, external interconnection means 12 is shown made in opening 11 to source region 10 as is external interconnection means 15 shown made in opening 14 to drain region 13. Silicon dioxide insulating layer 19 is shown around gates 16' and 16" and passivating layer 20 is shown over insulating layer 19 and interconnection means 12 and 15.

Further, silicon dioxide insulating layer 19 is shown provided around a pair of shield electrodes, 28 and 29. Shield electrode 28 completely surrounds external interconnection means 12 and is in insulating layer 19 directly across from the pn junction, occurring between source region 10 and other parts of semiconductor material body as 21, where this junction intersects the major surface of that body as shown in FIG. 13A. Similarly, shield electrode 29 surrounds external connection means 15 and is across from the pn junction, occurring between drain region 13 and other parts of semiconductor material body 21, where this junction intersects the major surface of that body.

Each of shield electrodes 28 and 29 are shown spaced away from the major surface of semiconductor material body 21 further than is either of gate conductors 16' and 16" spaced away from that surface. This spacing of the shield electrodes 28 and 29 from the major surface of semiconductor material body 21 is typically two to five times that spacing occurring between the same major surface and either of gate conductors 16' and 16".

Consider the situation when MOS field-effect transistor device is in the "off" condition, with a large reverse bias on the drain-substrate pn junction (meaning in FIG. 13A that drain region 13 is positive with respect to the substrate, i.e., the other portions of semiconductor material body 21) and with electrode 29 and gate 16" both connected together and to drain region 13 as shown by the dashed line circuits in FIG. 13A. Then the additional field emanating from shield electrode 29 and from gate conductor 16" will force the field emanating from the depletion region edge in drain region 13 to terminate on exposed charge in the depletion region occurring deeper below the major surface in semiconductor material body 21 to thereby lessen the field intensity at the drain region pn junction in the major surface of semiconductor material body 21. Relatively larger spacing between shield electrode 29 and the major surface of semiconductor material body 21 compared to the spacing between that surface and gate conductor 16" will increase the breakdown of voltages associated with the field emanating from shield electrode 29 as this electric field is spread out over a greater distance than is the electric field occurring on conductor 16". Nevertheless, the location of electrode shield 29 closer to the edge of the depletion region occurring in drain region 13 permits the field emanating from shield electrode 29 to have a substantial effect on the electric field emanating from this depletion region edge.

The insulation preventing electrical contact between gate conductor portion 16" and 16' permits having gate conductor 16" at the same voltage that is present on drain region 13 without device shown in FIG. 13A being switched "on". A similar situation exists at source region 10 for a reverse voltage applied to external interconnection means 12.

The dashed line circuit shown in FIG. 13A, in its entirety, permits operating the device shown there symmetrically, e.g., in an alternating polarity circuit application. When this structure is to be switched "on", the two switch bars 30 and 31, are both switched together to common switch point, 33. Switch point 33 is in turn connected to a source of positive voltage exceeding the threshold voltage of the device. In this condition, the device of FIG. 13A will operate as would an ordinary MOS field-effect transistor with gate conductor 16' and 16" together serving jointly as the transistor gate.

When the structure of FIG. 13A is desired to be, alternatively, switched to the "off" condition, switch bar 30 is connected to external connection means 12 which thereby connects gate conductor 16' to external connection means 12 and so to source region 10. Similarly, switch bar 31 is connected external connection means 15 and so to drain region 13. This arrangement permits holding the device of FIG. 13A in the "off" condition whether the voltage to be withstood is applied to external connection means 15, and so gate conductor 16", or to external connection means 12, and so to gate conductor 16', relative to external means 15. Since but one gate is connected to the voltage to be withstood, the other gate of the other polarity of the applied voltage, no channel will be completed under this other gate and so the device is off.

Figure 13B:
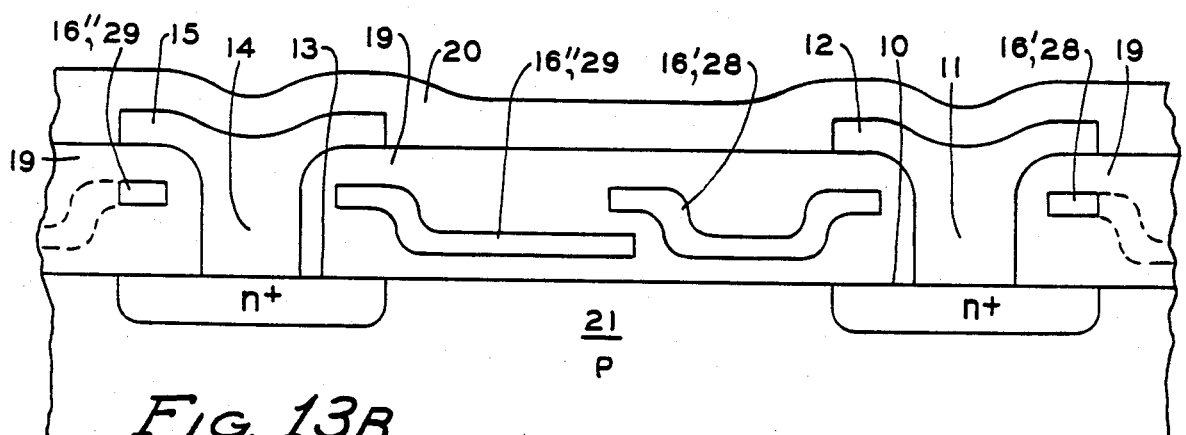

FIG. 13B shows the device of FIG. 13A but replacing the dashed line interconnections between shield electrode 28 and gate conductor 16', on the one hand, and between shield electrode 29 and gate conductor 16", on the other hand, by a continuous structure arrangement. This structure arrangement effectively provides a short between the gate conductor and its corresponding shield electrode in place of the dashed line short circuit shown in FIG. 13A. Thus, the shield and gate conductors associated with source region 10 in FIG. 13A are designated jointly by the same designations in FIG. 13B, this joint designation being 16', 28. Similarly, the joint shield electrode and gate conductor designation, associated with drain region 13, is 16", 29.

Figure 13C:
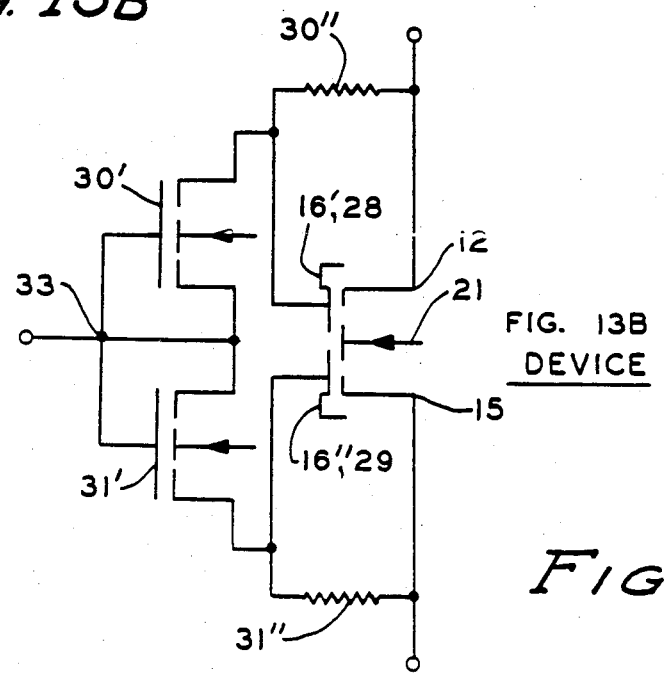
FIG. 13C shows a partial circuit schematic for operating the devices of the immediately preceding listed figures and FIG. 13E is a graph comparing a characteristic between the devices of the immediately preceding listed figures.

Assuming use of the FIG. 13B device, the dashed line circuitry of FIG. 13A may be more practically implemented therewith by use of the circuit shown in FIG. 13C. The switching bar 30 of FIG. 13A is implemented by a field-effect transistor, 30', and a coupling resistor, 30", at FIG. 13C. Similarly, switching bar 31, is provided by a field-effect transistor, 31', and a coupling resistor, 31". In some instances, a transistor switching circuit arrangement will be used in place of resistors 30" and 31".

The arrangement of FIG. 13C with resistors 30" and 31" can approximately provide the switching function of FIG. 13A. This approximation is sufficiently close enough to provide the switching functions achieved by the dashed line circuitry shown in FIG. 13A.

Figure 13D:
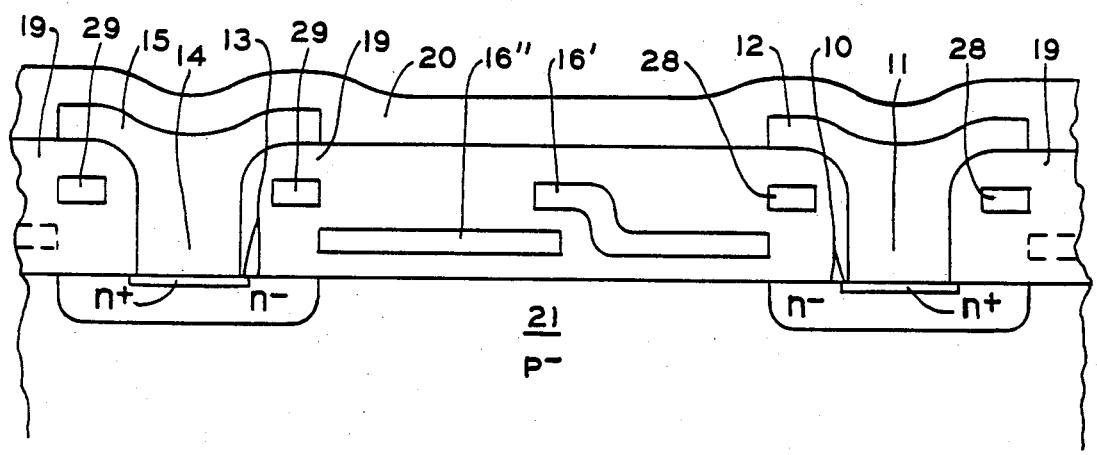

In both FIGS. 13A and 13B, dashed line structures are shown at the extreme right and left hand edges of the diagrams near the shield electrodes 28 and 29 or directly connected to the joint shield-gate conductor electrodes 16', 28 and 16", 29. These dashed line structures are shown as they would appear if the structures of FIGS. 13A and 13B were cross sections of field-effect device structures such as those shown in FIGS. 7, 6, 3A, 2, 3B or 3C. These dashed-line structures are also shown in FIG. 13D and in the structures shown in cross section in FIGS. 14 and 15 for the same purpose, i.e., if these structures represented cross sections of the field-effect devices appearing in the figures just listed. No further reference will be made to these dashed line structures.

The structure of FIGS. 13A or 13B can be advantageously combined with the structures of FIG. 11 or FIG. 12 to provide an even higher breakdown voltage than for the structure of FIGS. 13A of FIGS. 13B taken alone. The result of combining the structure shown in FIG. 11 with the structure shown in FIG. 13A is set out in FIG. 13D, although the combination of either FIGS. 13A or 13B could have been shown with combination of either of the FIGS. 11 and 12. No threshold voltage adjust region had been shown provided in any of FIGS. 13A, 13B or 13D but one can be to adjust the threshold voltage for the device if this option is desired.

In FIG. 13D, the dopant distribution in semiconductor material body 21 outside the source and drain regions, the dopant distribution of source and drain regions, the thickness of the insulating layer between semiconductor body 21 and gate conductor 16' and 16", and the doping level of the polysilicon external connection means 12 and 15 are all such that drain regions 10 and 13 can be completely depleted of charge carriers prior to avalanche breakdown of the pn junctions surrounding these regions when these junctions are subjected to reverse bias voltage. In a typical situation, doping of semiconductor material body 21 will be such that there will be boron atoms present reaching a concentration of up to $2 \times 10^{16}$ atoms/cm$^3$. The doped polysilicon n-type conductivity source and drain interconnection means 12 and 15 are typically doped by phosphorus to the extent of $10^{18}$ to $10^{19}$ atoms/cm$^3$.

There will also be phosphorus atoms used in doping the n-type conductivity source and drain regions 10 and 13 in semiconductor material body 21 on the order of $0.1-4 \times 10^{16}$ atoms/cm$^3$. This will be provided by a carefully controlled dose in an ion implantation step to carefully control the total number of net impurity atoms per unit area provided in a semiconductor material body below the portion of semiconductor material body major surface intersected by the source and drain regions. That is, the ion implantation net dose, i.e., the integral of the concentration over depth in the semiconductor material body 21, must be controlled, so the excess of phosphorus atoms in either the source region 10 or the drain region 13 over the boron dopant atoms there is due to a dose of less than approximately $1 \times 10^{13}$ atoms/cm$^2$. Again, this net may be over the dopant concentration appearing in the semiconductor material body 21 outside the source and drain regions generally, or above a threshold adjust region provided adjacent to the major surface of semiconductor material body 21.

Once again, gate conductor 16' or 16" can be either of doped polysilicon or of metal. Finally, there will be a heavily doped region occurring in source region 10 and one in source region 13 just below the interface of the doped polysilicon external connection means 12 and 15, respectively. These heavily doped n+-type conductivity regions will typically extend less than 0.3 μm below the major surface of semiconductor material body 21.

Figure 13E:
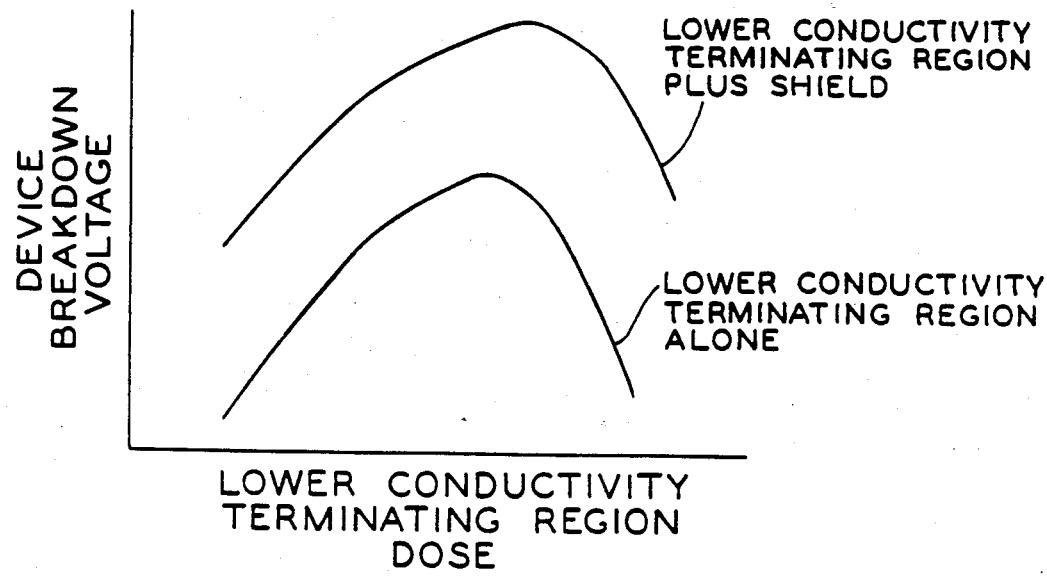

FIG. 13E shows graphs of device breakdown voltage being plotted against the dose used in providing those portions of either source region 10 or drain region 13, in semiconductor material body 21, occurring outside of the heavily doped portions appearing just below polysilicon external interconnection means 12 and 15, respectively. These relatively lightly doped portions of region 10 and drain region 13 can be termed lower conductivity terminating regions in being portions of the complete terminating regions which serve as source region 10 and drain region 13 in FIG. 13D. The lower curve is labeled lower conductivity terminating region alone and represents the breakdown voltage versus dose for the structure shown in either of FIGS. 11 or 12 without the presence and use of a shield electrode such as shown in FIGS. 13A and 13B.

The shape of this lower curve can be explained by noting that in lower doses, the lower conductivity terminating region becomes so lightly doped as to appear nearly intrinsic or actually as part of the main portion of semiconductor material body 21 so that only the heavily doped n+ region below polysilicon external connection means is effective is acting as the terminating region in semiconductor material body 21. In such a circumstance, the device appears as an ordinary MOS field-effect transistor with the n+-type conductivity regions serving as the source and drains therein, the lightly doped regions being generally ineffective. At high doses on the right hand edge of the lower curve of FIG. 13E, the doping in what is supposed to be at the lightly doped portion of the terminating regions becomes so great as to not differ much from the source and drain regions in an ordinary MOS field-effect transistor so that the entire source region 10 and drain region 13 appear as ordinary source and drain regions for such a transistor.

The upper curve in FIG. 13E shows that the breakdown voltage can be increased at every dose for which the curve is presented, at least when the proper parameters are chosen for the structure shown in FIG. 13D. Thus combining the structures of FIGS. 13A or 13B with either of the structures shown in FIG. 11 or FIG. 12 can lead to a device with a higher breakdown voltage. The general shape of the upper is explained in the same manner as the shape of the lower curve.

An alternate version of the structure shown in FIG. 13 which can provide many of the same advantages, is shown in FIG. 14. In FIG. 14A, there is now but one gate conductor 16 as opposed to the two split gate conductors 16' and 16" shown in FIG. 13A. There is also but one shield electrode, 34, shown in FIG. 14A as opposed to the two shield electrodes 28 and 29 shown in FIG. 13A. The structure shown in FIG. 14A is more readily fabricated in monolithic integrated circuit form than are the structures shown in FIG. 13. Further, much of the switching circuitry shown in dashed lines in FIG. 13A to operate the device shown there is not required for operating the device shown in FIG. 14A.

This is because the gate conductor 16 can be operated entirely independently of shield electrode 34. Shield electrode 34 can be operated at some positive, constant voltage greater than the threshold voltage of the device shown in FIG. 14A but need not be operated at a voltage as high as the voltage to be withstood in the "off" condition at either of the external connections 12 or 15.

Figure 14A:
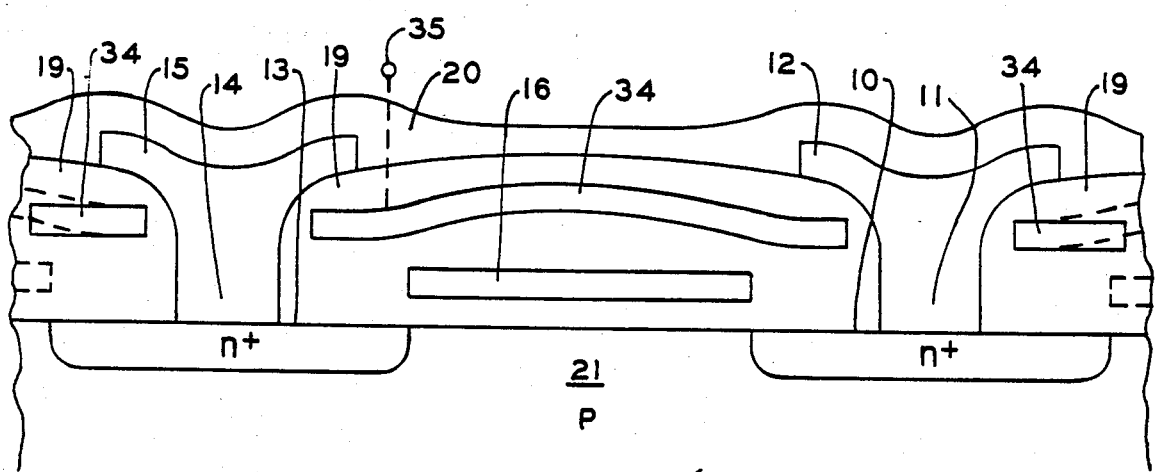

That is, shield electrode 34 can be operated at a constant positive voltage whether the device of FIG. 14A is desired to be in the "on" condition or the "off" condition. In the "on" condition, the shield electrode 34 will be at a positive voltage as will gate electrode 16 both of which will act to induce formation of a channel region in the semiconductor material between source region 10 and drain region 13, although, gate conductor 16 will be much more effective in achieving this inducement by being closer to the semiconductor material. When the device structure of FIG. 14A is desired to be in the "off" condition, shield electrode 34 will act just as did shield electrodes 28 and 29 in FIG. 13A. The electric field emanating from electrode 34 will force a reduction in the electric field intensity occurring at the semiconductor material major surface intersections of the pn junctions around source region 10 and drain region 13, respectively, to thereby increase the breakdown voltage of the device shown in FIG. 14A. Further, the optimum value of voltage for this purpose to be applied to shield electrode 34 can be chosen because shield electrode 34 is not connected to either source region 10 or to drain region 13, as were shield electrodes 28 and 29 in FIGS. 13A and 13B. In these structures in FIG. 13, it was possible that the voltage applied to shield electrodes 28 and 29 would be too high for achieving the best breakdown voltage as possible and could even contribute to an increase in breakdown voltage in some configurations. A dashed-line interconnection, 35, for connection to a voltage supply is shown made to shield electrode 34 and, of course, no switching function is shown with this dashed interconnection circuit.

Figure 14B:
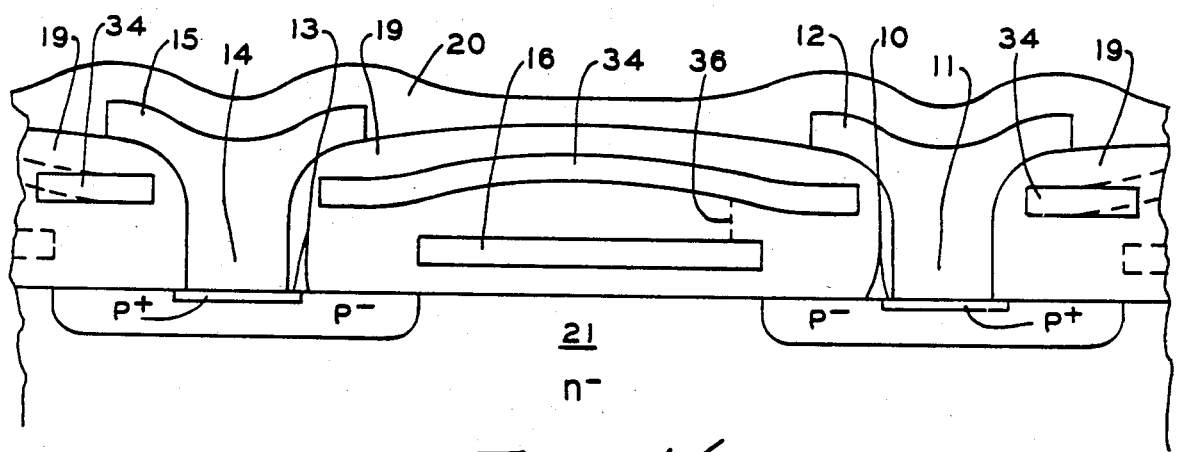

Again, the structure shown in either of FIGS. 11 or 12 can be advantageously combined with the structures shown in FIG. 14A. The result is shown in FIG. 14B in a p-channel device where again the dopant distribution in semiconductor material body 21 outside drain region 10 and source region 13, the dopant distribution in the lightly doped portions of source region 10 and drain region 13, the doping level of the polysilicon external interconnection means 12 and 15, and the thickness of the insulating layer between gate conductor 16 and the major surface of semiconductor material body 21 are all chosen so that source region 10 or drain region 13 can be completely depleted of charge carriers prior to avalanche breakdown of the pn junctions surrounding these regions when these junctions are subjected to a reverse bias voltage. Typical values for these various parameters of the configuration of FIG. 14B for a successful device are approximately those given for the device of FIG. 13D but of course the dopant types are reversed in position across the junctions since the device of FIG. 14B is a p-channel device rather than the n-channel device shown in FIGS. 11, 12, and 13. This change from n-channel to p-channel devices is given only as an indication that either form can be constructed although there may be some advantages for one form over the other in any particular device use or application.

Figure 14C:
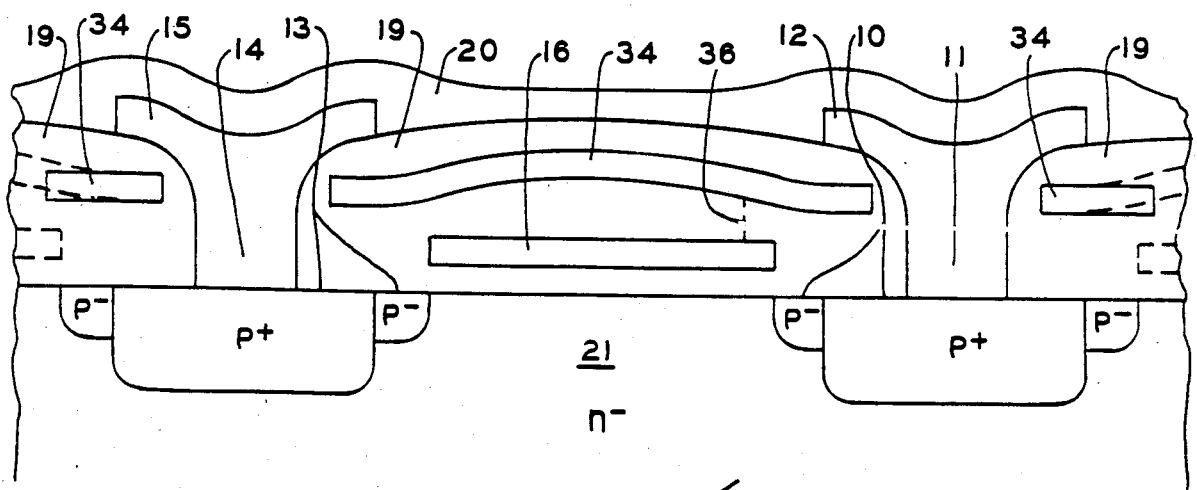

Another version is shown in FIG. 14C which relies on only a portion of the structure shown in either FIGS.

11 or 12 to also gain an advantage in the breakdown voltage achieved. That is, rather than having the lightly doped portion of source region 10 or drain region 13 entirely surround the p+ region occurring below external interconnection means 12 and 15, respectively, (except along the major surface of semiconductor material body 21), the lightly doped region occurs in FIG. 14C as an annulus region around a p+ region which is also in contact with the remaining portion of semiconductor material body 21 below this annulus.

The configuration shown in FIG. 14C does not give as high a breakdown voltage as the configuration shown in FIG. 14B but does provide a greater breakdown voltage than does the structure shown in FIG. 14A. Furthermore, the structure shown in FIG. 14C can be fabricated in a completely self-aligned manner to thereby provide a smaller device insofar as use of area of the major surface of semiconductor material body 21 is concerned as compared to the area required to fabricate the device shown in FIG. 14B for the same "on" condition channel resistance. Thus, if in the particular use involved, if the breakdown voltage achieved by the device of FIG. 14C is sufficient, the fabrication of a device or monolithic integrated circuit using the structure of FIG. 14C will be less costly, through permitting a smaller chip, than one relying on the configuration shown in FIG. 14B. A detailed description of a process for manufacturing the structure of FIG. 14C is given below in which typical values are also provided for the dopant distributions, spacings etc.

FIG. 14D again shows a plot of the device breakdown voltage versus the lower conductivity terminating region dose for the structures of either FIG. 14B or FIG. 14C, although the values of the curves plotted for the actual devices in these two figures would differ from one another. The lowest curve designated lower conductivity terminating region alone, represents the situation in FIGS. 11 or 12, i.e., FIGS. 14B or 14C without the presence and use of shield electrode 34. The topmost curve represents the situation in either FIGS. 14B or 14C when shield electrode 34 is operated at a negative 60 volts which is the proper polarity for the p-channel device as shown in FIGS. 14B and 14C. The shape of these curves is explained exactly in the way the shape of the curves appearing in FIG. 13E is explained.

Figure 14D:
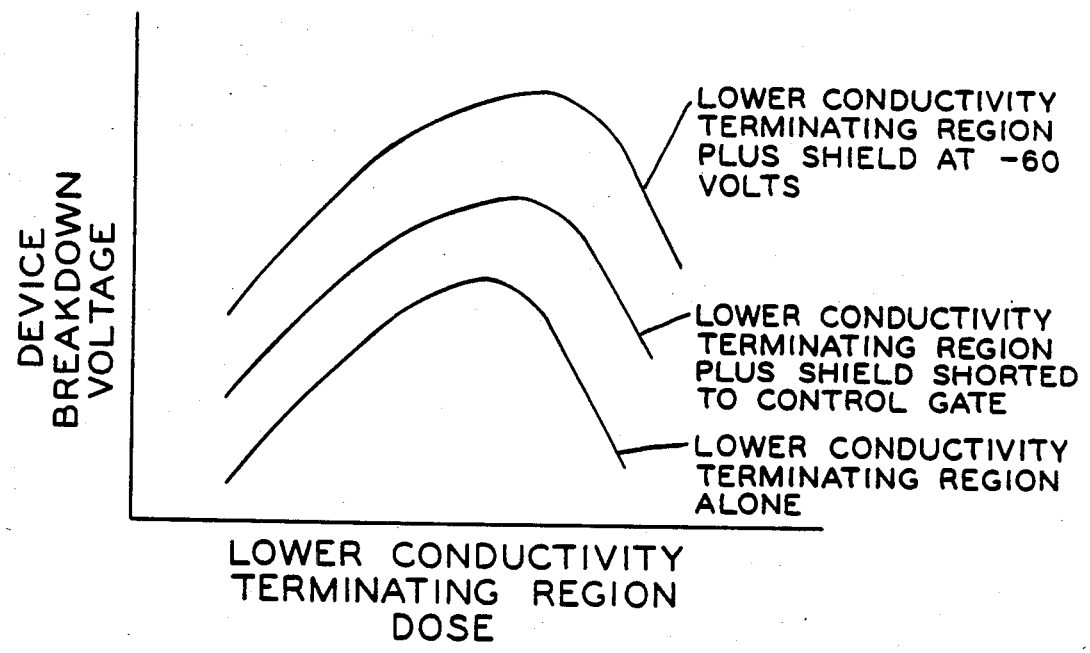
FIG. 14D is a graph comparing a characteristic between the devices of the immediately preceding listed figures.

However, an intermediate curve is also shown in FIG. 14D which represents the situation in either FIGS. 14B or 14C in which shield electrode 34 is directly electrically connected to gate conductor 16 or to semiconductor material body 21 outside the terminating regions, i.e., the substrate. The fact that shorting shield electrode 34 to gate conductor 16 results in a higher breakdown voltage than in the absence of shield electrode 34, although not as high as can be achieved when shield electrode 34 is biased to an optimum voltage, is quite useful. This is because no further power supply is required and no provisions need be made for an external connection of such a power supply to a device or a monolithic integrated circuit chip having such a device. That is, the shield electrode 34 can be directly electrically connected to gate conductor 16 or the substrate right in the device or in the monolithic integrated circuit chip containing the device without any further interconnections being needed.

That shorting of field electrode 34 to gate conductor 16 results in a higher breakdown voltage than would be the case in the absence of shield electrode 34 may seem unexpected in view of the earlier description of how the presence of a shield electrode permits reaching a higher breakdown voltage. The earlier description indicated that a voltage on a shield electrode leads to an electric field emanating from the shield electrode forcing the electric field emanating from the edge of the depletion region in the source or drain region away from the pn junctions around each of these source and drain regions at the intersection of these junctions with the major surface of semiconductor material body 21. Here, there is likely to be little or no voltage occurring on the shield electrode 34 when shorted to gate conductor 16 because gate 16 will likely be at or near zero volts to hold the device in the "off" condition. Thus, there will be no electric field emanating from shield electrode 34. Rather, there will terminate on shield electrode 34 a portion of the electric field emanating from the depletion region edge, either of the source region 10 or drain region 15 depending on which of these is subjected to withstanding a reverse bias voltage.

And indeed, this is the explanation of why the electric field intensity is reduced across the pn junctions surrounding either source region 10 and drain region 13 when subjected to a reverse bias voltage when shield electrode 34 is shorted to gate conductor 16 or the substrate. There is not an electric field emanating from shield electrode 34 to force a change in the electric field occurring at intersection of these pn junctions on the major surface of semiconductor material body 21. Rather, the field emanating from the depletion region edge, in whichever of source region 10 or drain region 13 is withstanding a reverse voltage, terminates on shield electrode 34 in contrast to otherwise having to termlnate on gate concuctor 16 or on exposed charge in the depletion region portion occurring in semiconductor material body 21. Thus, by diverting part of the electric field away from terminating on charge in semiconductor material body 21 or on gate conductor 16, a smaller electric field will exist along paths from the depletion region edge to semiconductor material body 21 and gate conductor 16 for any given voltage being withstood by the pertinent terminating region than would occur if shield electrode 34 was not present. As a result, a larger reverse voltage can be applied to the pn junctions around either source region 10 or drain region 13 before the electric field leading to breakdown across the junctions around these regions is reached. Further, the relative positions of shield electrode 34 and the more lightly doped portions of either source region 10 or drain region 13 lead to less curvature in the electric field which also increases the breakdown voltage.

Three further advantages come from the structures shown in either of FIGS. 14B or 14C, at least when gate 16 shorted to electrode 34. First, note that there will be no electric field generated between the substrate and gate conductor 16 and shield electrode 34 when the device in either of these figures is in the "off" condition. This is true since the substrate and the gate are at approximately the same voltage potential to produce "off" condition. Thus, there will be little Fowler-Nordheim tunnelling between the substrate and gates when the device is in the "off" condition which can lead to unusual operating results if this occurs.

Second, because of the presence of shield electrode 34, the lightly doped portion of either source region 10 or drain region 13 will have a depletion region formed along the major surface of semiconductor material body 21, with an edge more or less parallel with this surface, as well as along the pn junctlon between these regions and semiconductor material body 21. As a result, the depletion region along the junction into semiconductor material body 21 need not grow as rapidly with increasing voltage and so the punch-through voltage of the device for a given width of gate conductor 16 is increased over what it would be in the absence of shield electrode 34.

Finally, the use of shield electrode 34 along with lightly doped portions of source region 10 and drain region 13 for the purpose of increasing the breakdown voltage, also aids in reducing the "on" condition channel resistance for the device structure shown in FIGS. 14B and 14C over what it would be in the absence of shield electrode 34. This is because the application of a substantial voltage to gate region 16 for the purpose of switching "on" the device shown in either of these figures also leads to a substantial voltage appearing on shield electrode 36. This voltage on shield electrode 36 then aids in increasing the enhancement occurring at the major surface of semiconductor material body 21 in these lightly doped portions of one or the other of source region 10 and drain region 13 to thereby reduce "on" condition channel resistance.

A possible disadvantage in the use of shield electrode 34 either of FIGS. 14B or 14C without the shield electrode connected to gate conductor 16 comes about because of the possibility of field-induced junction breakdown. This is the result of voltage, occurring on shield electrode 34, inducing an inversion layer in semiconductor material body 21 underneath the edges of the shield electrode which would serve as a virtual source and which would have a sharp corner with a relatively low voltage breakdown. However, proper configurational choices, or limiting voltages applied to shield electrode 34, can prevent this from occurring.

Because of the desirable possibility of having shield electrode 34 directly electrically connected to gate conductor 16, a dashed line interconnection, 36, has been shown in FIGS. 14B and 14C as a possible means for accomplishing this shorting. However, this need not be a separate external connection but could be a connection made in the device itself or in a monolithic integrated circuit containing such a device. In fact, the device may be fabricated in such a manner that the doped polysilicon or metal making up shield electrode 34 and gate conductor 16 actually join one another to remove any need for forming a separate interconnection, external or internal. As earlier noted, shield 34 can be connected to the substrate, i.e., portions of semiconductor body 21, but not while retaining all of the above advantages.

Figure 15A:
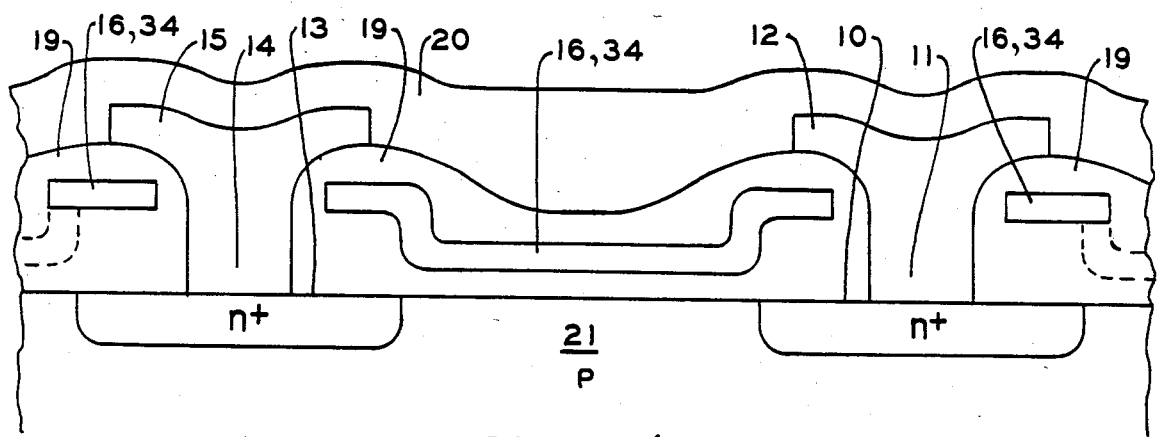
FIGS. 15A, 15B and 15C show a cross section of other versions of a field-effect device that can also withstand a substantial reverse bias voltage.
Figure 15B:
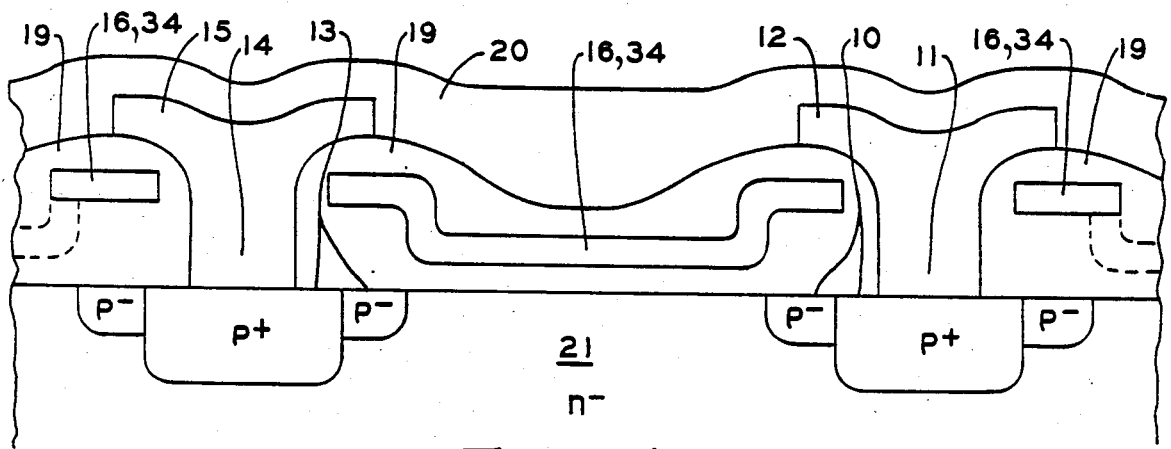

A further possibility is shown in FIG. 15 for accomplishing this direct electrical connection between shield electrode 34 and gate conductor 16 as they were first shown in FIGS. 14B and 14C. That is, the shield electrode 34 and gate conductor 16 can be formed as a common structure as shown in FIG. 15A which corresponds to the structure shown in FIG. 14A. As a result, this common structure has been labeled with a joint designation 16, 34. Similarly, FIG. 15B corresponds to FIG. 14C.

Figure 15C:
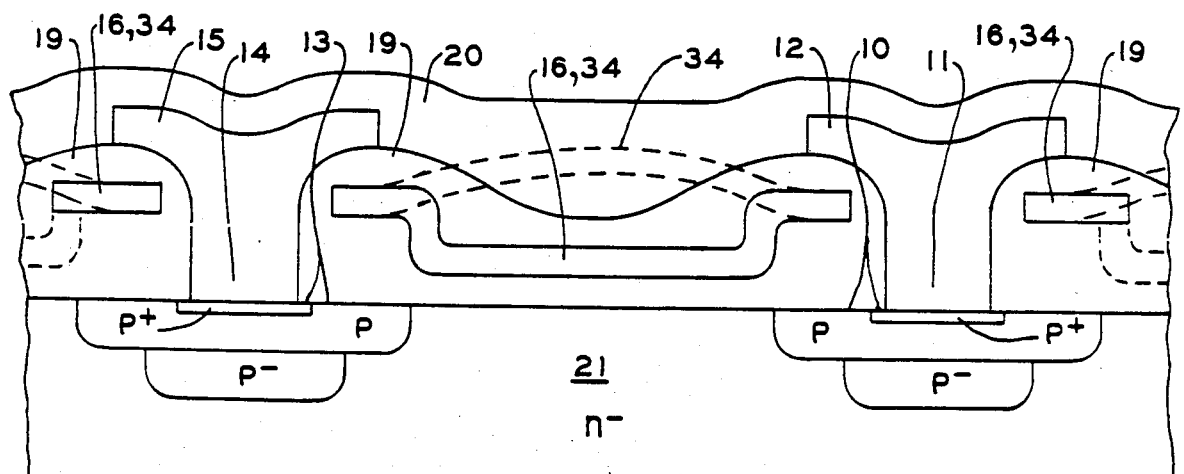

FIG. 15C corresponds to the structure shown in FIG. 14B but with a change in the lightly doped portions of source region 10 and drain region 13. This change is the appearance of a hump in the bottom part of the lightly doped portion in each of source region 10 and drain region 13. This hump can occur because of an alternative method of fabricating the structure shown in FIG. 15C. In this method of fabrication, the hump part of the lightly doped portion in each of regions 10 and 13 is provided separately from the remaining parts of lightly doped portions in regions 10 and 13. Of course, this two-part fabrication of the lightly doped portions in each of regions 10 and 13 could have been provided in the structure shown in FIG. 14B and so a corresponding dashed line version of shield electrode 34 is shown in FIG. 15C to indicate this possibility. In accord, dashed line versions are shown to rise from the shield electrode portions occurring at the extreme right hand and left hand edges of the structure in FIG. 15C as well as the dropping portions shown. These are both shown, as indicated before, to indicate the structure which would occur if the cross section of FIG. 15C was merely a part of a field-effect device having several source and drain regions therein as earlier described.

Turning now to FIG. 16, the results of steps in a fabrication process for manufacturing the device shown in FIG. 14C are shown. The process starts with a semiconductor material body, the body being typically silicon and doped with phosphorus to the extent of having a resistivity of 4 ohm-cm. The silicon is typically Czochralski grown and has a major surface, through and on which the fabrication process will take place, which is a (100) plane. This semiconductor material body is designated 110 in FIG. 16A and is shown to have an $n^-$-type conductivity.

A thin layer of silicon dioxide, 111, is thermally grown on the major surface of semiconductor material body 110 by placing the body in an oxygen atmosphere at 975° C. for two hours, the layer then having a thickness of approximately 650 Å. Then a layer of silicon nitride, 112, is deposited on the surface of layer 111 in a standard chemical vapor deposition process, the silicon nitride layer being approximately 2000 Å thick. This is followed by depositing yet another layer of silicon dioxide, 113, of approximately 1000 Å thickness onto layer 112, again by using a standard chemical vapor deposition process. Finally, a photoresist layer is provided on layer 113 and provided with openings therein in a desired pattern all done using a standard process.

This photoresist-dioxide layer arrangement permits silicon dioxide layer 113 to be etched through the openings in the photoresist layer using buffered HF as an etchant. Next, the photoresist is stripped away and this is followed by etching silicon nitride layer 112 through the openings in layer 113 using a standard wet etch process using $H_3PO_4$. These openings are where field regions will be formed which will separate from one another the electronic component devices to be formed. These field regions surround and so outline the feature regions in and below which the individual electronic component devices will be formed.

While MOS field-effect transistors having but a single source and single drain will be exhibited as being formed in the four feature regions shown in FIG. 15A, field-effect devices of the kind described above having many sources and drains can also be formed by the same process. They would be represented in FIG. 15 by larger feature areas which would accommodate several sources and drains in the manner above described.

Following the provision of the field region openings through layers 113 and 112 the exposed portions of layer 111 and the silicon below are subjected to an ion implantation step using phosphorus ions having an energy of 120 kev. This implantation occurs with a dose $10^{13}$ ions/cm$^2$. This implantation is used to adjust the field regions threshold, increasing this threshold to prevent MOS field-effect transistor action between adjacent electron component devices in adjacent feature regions. The implantation step forms an n+-type conductivity region at approximately 0.1 μm below the major surface of semiconductor material body 110.

The field regions are then oxidized by thermal growth through the openings in layers 113 and 112 by placing the structure at 975° C. for ten hours in an oxygen atmosphere to form the field oxide, 114. Concurrently, the original implanted ions in the field regions are driven deeper by diffusion into semiconductor material body 110. The results are shown in FIG. 16B where the original implanted phosphorus ions in the field regions have been driven to a depth of 1.0 μm and are designated 115.

Without further masking, the remnants of silicon dioxide layer 113 are then etched away using buffered HF. No masking is required because layer 113 is much thinner than field oxide 114 and the simultaneous etching thereof with the etching away of layer 113 does not remove too much of regions 114. As a result of this etching, layer 114 is redesignated 114'. Then all of silicon nitride layer 112 is stripped away by etching with $H_3PO_4$.

Next, a photoresist layer having selected openings therein is provided over the surface of oxide layer 111 in a standard process. These openings are made in this photoresist layer to expose those portions of layer 111 over feature regions that are to have depletion mode devices formed therein, and are therefore to undergo an ion implantation to form a depletion mode region. The fabrication process illustrated by FIG. 16 will demonstrate both making ordinary MOS field-effect transistors and high breakdown voltage MOS field-effect transistors. In addition, one ordinary MOS field-effect transistor will be an enhancement mode and the other will be a depletion mode. These same alternatives will be shown for the high breakdown voltage MOS field-effect transistors.

After the openings are provided in the photoresist on layer 111, an ion implantation step is performed using boron ions having energy of 100 kev with a dose used of from 0.5 to $4.0 \times 10^{12}$ ions/cm$^2$ which results in a depletion mode region having a pn junction occurring at approximately 0.3 μm below the major surface of semiconductor material body 110. The results are shown in FIG. 16C where the photoresist layer is designated 116. The resulting depletion implant region in the high breakdown voltage MOS field-effect transistor is designated 117 while the depletion mode region for the ordinary MOS field-effect transistor is designated 118.

After completing the depletion mode region implant step, photoresist 116 is stripped away. Then, the device is annealed by placing the structure at 975° C. for a half hour. Thereafter, silicon dioxide layer 111 is also etched away using buffered HF. Etching of layer 111 occurs without further masking because, again, the field-oxide regions 114' are relatively thick. The etching does remove a part of the field oxide regions and so these are now redesignated 114".

Next, a gate oxide is thermally grown by placing the structure at 975° C. in an oxygen atmosphere containing 4% HCl until the gate oxide thickness reaches somewhere between 1000 Å and 2500 Å with the thickness chosen depending on the design for the device being fabricated in light of its planned utilization. Then, 5000 Å of phosphorus doped polysilicon, doped to have a sheet resistance of 50 ohms/□ is deposited in a standard chemical vapor deposition process. Of course, undoped polysilicon could have been deposited and then implanted with a dopant to make it highly conductive. After the polysilicon deposition, silicon dioxide is deposited by a standard chemical vapor deposition process on the doped polysilicon to a depth of 4000 Å. Finally, this silicon dioxide deposition is followed by providing a photoresist layer with a pattern of desired openings over the silicon dioxide by a standard process.

The openings in this last provided photoresist layer are made to occur in locations below which polysilicon gate region portions are not desired to be provided for the MOS field-effect transistors being formed. The silicon dioxide provided over the polysilicon is then etched using buffered HF through these openings in the photoresist followed by using a standard plasma etch process to remove the doped polysilicon where unwanted. This plasma etching is then followed by stripping away the photoresist by use of an etchant. The result is shown in FIG. 16D where the doped polysilicon is designated 119 as it remains to form the gates for each of the MOS field-effect transistors being fabricated. The silicon dioxide remaining thereon originally used as a mask for forming the polysilicon gates, is designated 120. The silicon dioxide layer used as the gate oxide separating the gates 119 from the major surface of semiconductor material body 110 is designated 130.

Also shown in FIG. 16D is the result of providing the lower conductivity terminating region portions, i.e., the lower conductivity portions of the source and drain regions, which is accomplished by implanting boron ions in semiconductor material body 110 using an energy of 100 kev and a dose of from $10^{12}$ to $10^{13}$ ions/cm$^2$. The actual dose used in this range depends on the planned use for the device being formed. Both the field oxide regions 114" and polysilicon gates 119 with silicon oxide caps 120 are used as implantation masks. As a result, the implanted lower conductivity portions just provided are self aligned with the field oxide and the gates already provided in each of the MOS field-effect transistors being formed. The pn junctions between the lower conductivity portions of the drain and source regions and other portions of semiconductor material body 110 extend to 0.3 μm below the major surface of this body.

The implanted regions forming the lower conductivity portions of the source and drain regions, i.e., the terminating regions, of the high breakdown voltage enhancement mode MOS field-effect transistor are designated 121 and 122. The implant regions forming the lower conductivity portions of the terminating regions for the high breakdown voltage, depletion mode MOS field-effect transistor are designated 123 and 124. The implant depletion mode region for this transistor has been redesignated 117' in view of its being substantially narrowed to being just below gate region 119 for the device.

The regions resulting from the last implantation step located where the source and drain regions will occur for the ordinary enhancement mode MOS field-effect transistor are designated 125 and 126. Finally, the implanted regions located where the source and drain regions will occur for the ordinary depletion mode MOS field-effect transistor are designated to 127 and 128. Depletion mode region 118 has been redesignated 118' in view of its being substantially narrowed to being just below gate 119 for the ordinary depletion mode device.

As the next step, silicon dioxide is then provided over gate oxide 130 except where covered by polysilicon gates 119, over polysilicon gates 119 except for cover by gate caps 120, and over gate caps 120. This silicon dioxide is provided by first thermally growing 1600 Å of silicon dioxide on the exposed surfaces of semiconductor material body 110 and gates 119 by placing the structure in an oxygen atmosphere containing 4% HCl at 975° C. for three hours followed by depositing on this structure 3000 Å of silicon dioxide containing 1% phosphorus in a standard chemical deposition process. This structural arrangement is placed at 950° C. for a half hour for "densification" of the silicon dioxide so provided. As a result, silicon dioxide appears all around gate regions 119 and so all this oxide, including gate oxide layer 130, is now generally designated by 130'.

At this point in the process, shield electrodes are provided through depositing in a standard chemical deposition process a polysilicon layer of 5000 Å thickness doped with phosphorus to the point of having a sheet resistance of 50 ohms/□. Of course, undoped polysilicon could be deposited which could later be doped by diffusion or ion implantation. Following this deposition, silicon dioxide is grown to a thickness of 0.1 $\mu$m on the doped polysilicon layer by placing the structure in an oxygen atmosphere at 975° C. for one hour. This silicon dioxide deposition is followed by providing a photoresist layer having a desired pattern of openings on the deposited silicon dioxide using a standard process. These openings are provided in the photoresist layer at locations such that a subsequent introduction of dopants in semiconductor material body 110 below these openings will result in providing the higher conductivity terminating region portions, i.e., higher conductivity portions of the drain and source regions, of the high breakdown voltage transistor devices and the source and drain regions in the ordinary transistors. The higher conductivity terminating region portions are located to be entirely within the lower conductivity portions of these regions when viewed from the major surface of semiconductor material body 110.

The silicon dioxide below these openings in the photoresist layer is etched away using buffered HF. Then the photoresist is stripped away. This silicon dioxide etching and photoresist stripping is followed by using a HF/HNO$_3$/CH$_3$COOH mixture in a 1:100:110 ratio through the openings in the silicon dioxide layer to etch concentric openings in the last deposited doped polysilicon silicon dioxide below these openings in the photoresist layer followed by use of another etchant to provide concentric openings in the polysilicon layer. Note that none of this second polysilicon layer, provided for use as shield electrodes, will be required for use over the ordinary MOS field-effect transistors being fabricated in the two right hand feature regions in FIG. 16 since shield electrodes are not used in such electrical components. The photoresist layer is stripped away at this point.

The results of these steps are shown in FIG. 16E where the remaining portions of the shield electrode polysilicon layer are designated 131. The silicon dioxide caps over these remaining shield polysilicon portions 131, used as masks during etching of the polysilicon, are designated 132.

With the openings through silicon dioxide layer 132 and polysilicon layer 131 complete, silicon dioxide layer 130' is now etched using buffered HF and using polysilicon shield electrodes 131 and silicon dioxide field regions 114" as etching masks. As a result, openings are provided in silicon dioxide layer 130' all the way to the major surface of semiconductor material body 110 beneath the openings appearing in the polysilicon shield electrodes 131. Openings also occur in the ordinary field-effect transistor feature regions adjacent to the field oxide regions 114" and adjacent to gate regions 119 for these devices, gate regions 119 becoming etching mask portions after the silicon dioxides over them is etched away. Concurrently, the silicon dioxide layer remnants 132 are entirely removed as are portions of field oxide 114". Thus, a part of the lower conductivity terminating regions 121, 122, 123 and 124 are exposed at the major surface of semiconductor material body 110. All of the lower conductivity regions 125, 126, 127 and 128, located where the sources and drains of the ordinary transistors are to be formed, as they intersect the major surface of semiconductor material body 110 are exposed. The field oxide regions 114" are again redesignated 114''' because of the etching step removing parts of these regions.

Then an implantation step is performed to provide the higher conductivity terminating region portions for the high breakdown voltage, MOS field-effect transistors and to provide the complete source and drain regions for the ordinary MOS field-effect transistors. Boron ions having an energy of 100 kev are implanted using a dose of $4 \times 10^{15}$ ions/cm$^2$ followed by annealing the device at 950° C. for a half hour. This is followed by thermally growing 1000 Å of silicon dioxide, through placing the structure in an oxygen atmosphere at 975° C. for one and a half hours, on the exposed surface portions of the major surface of semiconductor material body 110 and on polysilicon shield electrodes 131. On this thermally grown oxide there is then deposited 6000 Å of silicon dioxide having a 6% phosphorus therein in a standard chemical vapor deposition process. Following this, the ion implanted regions just provided are caused to diffuse deeper into semiconductor material body 110 by placing the device at 1025° C. for 2.5 hours. The pn junctions resulting from this diffusion reach approximately 1.5 $\mu$m below the major surface of semiconductor material 110. The earlier provided depletion mode regions, 117' and 118' and the earlier provided lower conductivity terminating region portions 121, 122, 123 and 124 are forced deeper into semiconductor material body 110 by this diffusion, all reaching approximately 0.4 $\mu$m below the major surface of semiconductor material body 110.

The results of these steps are shown in FIG. 16F. Field oxide regions 114''' will be merged into the silicon dioxide layer provided after the last implantation step, as will the remaining portions of the silicon dioxide 130' around gates 119. Nevertheless, field oxide regions 114''' and the remaining portions of oxide 130' have been indicated by dashed lines in FIG. 16F to aid in understanding what has happened in the process steps to this point. The new layer of silicon dioxide, provided after the last implantation step, is designated 133 and this will be the general designation for the merged structure.

The higher conductivity portions of the terminating regions, i.e., of the drain and source regions, for the high breakdown voltage, enhancement mode MOS field-effect transistor have been designated 134 and 135. The lower conductivity terminating region portions have been redesignated 121' and 122' in view of the central portion of them having been transformed by the presence of regions 134 and 135 and because of the greater depth these lower conductivity regions have now reached.

The higher conductivity terminating region portions of the high breakdown voltage, depletion mode MOS field-effect transistor have been designated 136 and 137. The lower conductivity terminating region portions for this device have been redesignated 123' and 124' in view of the central portion of these lower conductivity regions having become part of the regions 136 and 137 and because of the greater depths reached by these lower conductivity terminating region portions. The depletion mode region has been redesignated 117'' because this region has reached a greater depth of semiconductor material body 110.

The terminating regions, i.e., the drain and source regions, for the ordinary enhancement mode MOS field-effect transistor have been redesignated 125' and 126' in view of the transforming of these regions from a p⁻ conductivity to a p+ conductivity. The terminating regions for the ordinary depletion mode MOS field-effect transistor have been redesignated 127' and 128' for the same reason. The depletion mode region has been redesignated 118'' in view of its greater depth this region has reached in semiconductor material body 110.

At this point, by a standard process, a photoresist layer is provided over layer 133 in which photoresist layer openings are provided which correspond to the desired locations for the external interconnection means to be provided. Silicon dioxide layer 133 is etched away using buffered HF beneath the openings provided in the photoresist layer. The external interconnection means is chosen here to be of metal although such means could be provided by doped polysilicon. The metal chosen is a copper-aluminum alloy and is deposited in a standard evaporation process as a layer of 2.0 μm thickness. A photoresist layer is provided over this metal layer in which openings are provided, all done in a standard process, at locations where no metal is desired. $H_3PO_4$/$HNO_3$/$CH_3COOH$ in a ratio of 50:1:5 is introduced as an etchant through these openings to remove the copper-aluminum alloy layer at these locations. Thereafter, an annealing step is performed at 450° C. for 30 minutes. Finally, a passivating layer of silicon dioxide containing 1% phosphorus is deposited on the device in a standard chemical vapor deposition process.

The results of these steps are shown in FIG. 16G. Silicon dioxide layer 133, field regions 114''' and remnants 130', shown merged in FIG. 16F as they were indicated above to be with the designation 133. This merged structure is designated 133' in FIG. 16G after a portion has been removed therefrom to permit providing external interconnection means. The copper-aluminum alloy structures to form the external interconnection means have been designated 138 in FIG. 16G. The passivating layer over external interconnection structures 138 and over silicon dioxide 133' is designated 139.

The results shown in FIG. 16G indicate how there can be simultaneously formed in one monolithic integrated circuit chip high breakdown voltage MOS field-effect devices, both enhancement mode and depletion mode, and ordinary MOS field-effect devices, again both enhancement mode and depletion mode. As noted above, the showing of several more terminating regions, i.e., source and drain regions, in the feature regions where the high breakdown voltage MOS field-effect transistors are formed would lead to a cross section for those device which could lead to the devices having geometry paralleling that of the devices shown in FIGS. 2, 3A, 3B, 3C, 6 and 7.

The relatively high breakdown voltage devices, either the enhancement mode or the depletion mode device, formed by the above process can be expected to have breakdown voltages of from 40 volts to 100 volts. On the other hand, the ordinary devices will have breakdown voltages under 30 volts. While the fabrication of p-channel devices has been shown, interchanging doping materials would lead to a similar process for fabricating n-channel devices.

The mebodiments of the invention in which an exclusive property or right is claimed are defined as follows:

1. A method for constructing a filed-effect transistor device at an outer major surface of a first semiconductor material body of a first conductivity type, said method comprising:

providing a first electrical insulating layer of a first thickness on said outer major surface, at least at a first major surface portion, said first insulating layer having a first insulating layer major surface on a side thereof opposite that side thereof which is in contact with said first major surface portion;

providing a first gate region on at least a portion of said first insulating layer major surface across said first insulating layer from less than all of said first major surface portion;

providing at least two lesser conductivity terminating region portions of a second conductivity type in said semiconductor material body intersecting said first major surface portion and spaced apart in said first major surface portion to thereby form at least two spaced apart intersection surfaces in said outer major surface, there being pn junctions resulting about each of said lesser conductivity terminating region portions separating these regions from remaining portions of said first semiconductor material body with these said pn junctions intersecting said first major surface portion to form a boundary about each of said intersection surfaces in said first major surface portion, said first gate region being directly across said first insulating layer from that space in said first major surface portion separating said two intersection surfaces;

providing a second electrical insulating layer of a second thickness on said first gate region and extending beyond said first gate region to be across from substantially all of each said lesser conductivity terminating region portion, said second insulating layer having a second insulating layer major surface on a side thereof opposite that side thereof which is in contact with said first gate region;

providing a first shield region on at least a portion of said second insulating layer major surface across from said first gate region and across from each of said lesser conductivity terminating region portions, but across from less than all of each of said lesser conductivity terminating region portions at least by virtue of a plurality of openings each provided through said first shield region and across from a contact surface located entirely within each said intersection surface; and providing higher conductivity terminating region portions of said second conductivity type in said semiconductor material body intersecting said first major surface portion at each of said contact surfaces across from each corresponding said opening in said first shield region, said higher conductivity terminating region portions having a conductivity occurring therein exceeding that occurring in those said lesser conductivity terminating region portions remaining after said providing of said higher conductivity terminating region portions.

2. The method of claim 1 wherein said providing of said first insulating layer is preceded by providing a low conductivity channel region of said second conductivity type in said semiconductor material body intersecting said first major surface portion.

3. The method of claim 1 wherein said providing of said first insulating layer is preceded by providing low conductivity terminating region portions of said second conductivity type in said semiconductor material body intersecting said first major surface portion with at least one provided around each location for a contact surface portion.

4. The method of claim 1 wherein said first insulating layer is also provided at a second major surface portion simultaneously with providing said first insulating layer at said first major surface portion but which is preceded by providing a low conductivity channel region of a second conductivity type in said semiconductor material body intersecting said second major surface portion, said providing a said first insulating layer being followed by (i) providing a second gate region on said first insulating layer major surface across said first insulating layer from said second major surface portion simultaneously with said providing of said first gate region and in a similar manner, by (ii) thereafter providing at least two further lesser conductivity terminating region portions of a second conductivity type in said semiconductor material body intersecting said second major surface portion simultaneously with said providing of said two lesser conductivity terminating region portions intersecting said first major surface portion and in a similar manner, by (iii) thereafter providing said second electrical insulating layer on said second gate region simultaneously with providing said second insulating layer on said first gate region and in a similar manner, by (iv) thereafter providing a second shield region on said second insulating layer major surface across from said second gate region simultaneously with said providing of said first shield region and in a similar manner, and finally by (v) thereafter providing at least two further higher conductivity terminating region portions of said second conductivity type in said semiconductor material body intersecting said second major surface portion simultaneously with providing said higher conductivity terminating region portions intersecting said first major surface portion and in a similar manner.

5. The method of claim 1 wherein said first insulating layer is also provided at a second major surface portion simultaneously with providing said first insulating layer at said first major surface portion and is followed by (i) providing a second gate region on said first insulating layer major surface across said first insulating layer from said second major surface portion simultaneously with said providing of said first gate region and in a similar manner, by (ii) thereafter providing at least two further lesser conductivity terminating region portions of a second conductivity type in said semiconductor material body intersecting said second major surface portion simultaneously with providing said two lesser conductivity terminating region portions intersecting said first major surface portion and in a similar manner, by (iii) thereafter providing said second electrical insulating layer on said second gate region simultaneously with said providing of said second electrical insulating layer on said first gate region and in a similar manner, by (iv) thereafter avoiding any permanent provision of said first shield region on any portion of said second insulating layer across from said second major surface portion, and finally by (v) thereafter providing at least two further higher conductivity terminating region portions of said second conductivity type in said semiconductor material body intersecting said second major surface portion at those locations where said further lesser conductivity terminating region portions intersect said second major surface portion simultaneously with said providing of said higher conductivity terminating region portions intersecting said first major surface portion and in a similar manner.

6. The method of claim 1 wherein said lesser conductivity terminating region portions and said higher conductivity terminating region portions are provided, at least in part, by ion implantation with having passed a maximum of $1 \times 10^{13}$ ions of that dopant leading to said second conductivity type in said lesser conductivity terminating region portions per square centimeter through said intersection surfaces in excess of those dopant atoms leading to said first conductivity type in said semiconductor material body immediately adjacent said intersection surfaces.

7. The method of claim 1 wherein said providing of said first insulating layer is preceded by providing a field insulating means intimately bound to said first semiconductor material body which is immediately adjacent to and substantially surrounds said first major surface portion in said outer major surface.

8. The method of claim 2 wherein said first insulating layer is also provided at a second major surface portion simultaneously with providing said first insulating layer at said first major surface portion and is followed by (i) providing a second gate region on said first insulating layer major surface across said first insulating layer from said second major surface portion simultaneously with said providing of said first gate region and in a similar manner, by (ii) thereafter providing at least two further lesser conductivity terminating region portions of a second conductivity type in said semiconductor material body intersecting said second major surface portion simultaneously with providing said two lesser conductivity terminating region portions intersecting said first major surface portion and in a similar manner, by (iii) thereafter providing said second electrical insulating layer on said second gate region simultaneously with said providing of said second electrical insulating layer on said first gate region and in a similar manner, by (iv) thereafter avoiding any permanent provision of said first shield region on any portion of said second insulating layer across from said second major surface portion, and finally by (v) thereafter providing higher conductivity terminating region portions of said second conductivity type in said semiconductor material body intersecting said first major surface portions at those locations where said further lesser conductivity terminating region portions intersects said second major surface portion simultaneously with said providing of said higher conductivity terminating region portions intersecting said first major surface portion.

9. The method of claim 3 wherein said first insulating layer is also provided at a second major surface portion simultaneously with providing said first insulating layer at said first major surface portion and is followed by (i) providing a second gate region on said first insulating layer major surface across said first insulating layer from said second major surface portion simultaneously with said providing of said first gate region and in a similar manner, by (ii) thereafter providing at least two further lesser conductivity terminating region portions of a second conductivity type in said semiconductor material body intersecting said second major surface portion simultaneously with providing said two lesser conductivity terminating region portions intersecting said first major surface portion and in a similar manner, by (iii) thereafter providing said second electrical insulating layer on said second gate region simultaneously with said providing of said second electrical insulating layer on said first gate region and in a similar manner, by (iv) thereafter avoiding any permanent provision of said first shield region on any portion of said second insulating layer across from said second major surface portion, and finally by (v) thereafter providing higher conductivity terminating region portions of said second conductivity type in said semiconductor material body intersecting said first major surface portions at those locations where said further lesser conductivity terminating region portions intersects said second major surface portion simultaneously with said providing of said higher conductivity terminating region portions intersecting said first major surface portion.

10. The method of claim 4 wherein said first insulating layer is also provided at a third major surface portion simultaneously with providing said first insulating layer at said first major surface portion and is followed by (i) providing a third gate region on said first insulating layer major surface across said first insulating layer from said third major surface portion simultaneously with said providing of said first gate region and in a similar manner, by (ii) thereafter providing at least two further lesser conductivity terminating region portions of a second conductivity type in said semiconductor material body intersecting said third major surface portion simultaneously with providing said two lesser conductivity terminating region portions intersecting said first major surface portion and in a similar manner, by (iii) thereafter providing said second electrical insulating layer on said third gate region simultaneously with said providing of said second electrical insulating layer on said first gate region and in a similar manner, by (iv) thereafter avoiding any permanent provision of said first shield region on any portion of said third insulating layer across from said third major surface portion, and finally by (v) thereafter providing higher conductivity terminating region portions of said second conductivity type in said semiconductor material body intersecting said third major surface portion at those locations where said latter further lesser conductivity terminating region portions intersect said third major surface portion simultaneously with said providing of said higher conductivity terminating region portions intersecting said first major surface portion.

11. The method of claim 8 wherein said lesser conductivity terminating region portions and said higher conductivity terminating region portions are provided, at least in part, by ion implantation with having passed a maximum of $1 \times 10^{13}$ ions of that dopant leading to said second conductivity terminating region portions per square centimeter through said intersection surface portions in excess of those dopant atoms leading to said first conductivity type in said semiconductor material body immediately adjacent said intersection surfaces.

12. The method of claim 9 wherein said lesser conductivity terminating region portions and said higher conductivity terminating region portions are provided, at least in part, by ion implantation with having passed a maximum of $1 \times 10^{13}$ ions of that dopant leading to said second conductivity terminating region portions per square centimeter through said intersection surface portions in excess of those dopant atoms leading to said first conductivity type in said semiconductor material body immediately adjacent said intersection surfaces.

13. The method of claim 10 wherein said lesser conductivity terminating region portions and said higher conductivity terminating region portions are provided, at least in part, by ion implantation with having passed a maximum of $1 \times 10^{13}$ ions of that dopant leading to said second conductivity terminating region portions per square centimeter through said intersection surfaces in excess of those dopant atoms leading to said first conductivity type in said semiconductor material body immediately adjacent said intersection surfaces.

* * * * *

UNITED STATES PATENT AND TRADEMARK OFFICE
CERTIFICATE OF CORRECTION

PATENT NO. : 4,735,914

DATED : April 5, 1988

INVENTOR(S) : T. E. Hendrickson and R.G. Koelsch

It is certified that error appears in the above-identified patent and that said Letters Patent is hereby corrected as shown below:

```
Column 34, line 17, cancel "filed-effect" and substitute
      --field-effect--
```

Signed and Sealed this

Thirty-first Day of July, 1990

Attest:

HARRY F. MANBECK, JR.

*Attesting Officer*   *Commissioner of Patents and Trademarks*